United States Patent
Eid et al.

(10) Patent No.: US 9,559,037 B2
(45) Date of Patent: Jan. 31, 2017

(54) PACKAGE INTEGRATED SYNTHETIC JET DEVICE

(71) Applicants: Feras Eid, Chandler, AZ (US); Jessica Gullbrand, Forest Grove, OR (US); Melissa A. Cowan, Hillsboro, OR (US)

(72) Inventors: Feras Eid, Chandler, AZ (US); Jessica Gullbrand, Forest Grove, OR (US); Melissa A. Cowan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 14/728,705

(22) Filed: Jun. 2, 2015

(65) Prior Publication Data
US 2016/0358841 A1    Dec. 8, 2016

(51) Int. Cl.
*H01L 23/467* (2006.01)
*F04D 33/00* (2006.01)
(Continued)

(52) U.S. Cl.
CPC ......... *H01L 23/467* (2013.01); *B05B 17/0653* (2013.01); *F15D 1/008* (2013.01); *H01L 21/4846* (2013.01); *H01L 21/6835* (2013.01); *H01L 23/49838* (2013.01); *H05K 1/0203* (2013.01); *H05K 1/181* (2013.01);
(Continued)

(58) Field of Classification Search
CPC ..... H01L 23/4735; F04D 33/00; F15D 1/0095
See application file for complete search history.

(56) References Cited

U.S. PATENT DOCUMENTS 6,457,654 B1    10/2002    Glezer et al.
7,682,137 B2 *    3/2010    Nakayama ............ H01L 23/467
                                                                310/317
(Continued)

FOREIGN PATENT DOCUMENTS

CN    103894306    7/2014

OTHER PUBLICATIONS

"PCT International Search Report and Written Opinion of the International Searching Authority, Jul. 25, 2016, 10 pages", PCT/US2016/027553.

*Primary Examiner* — Robert J Hoffberg
(74) *Attorney, Agent, or Firm* — Blakely, Sokoloff, Taylor & Zafman LLP

(57)    ABSTRACT

Embodiments include a synthetic jet device formed within layers of a package substrate, such as to provide a controlled airflow for sensing or cooling applications. The jet device includes an electromagnetically driven vibrating membrane of conductive material between a top and bottom cavity. A top lid with an opening covers the top cavity, and a permanent magnet is below the bottom cavity. An alternating current signal conducted through the membrane causes the membrane to vibrate in the presence of a magnetic field caused by the permanent magnet. By being manufactured with package forming processes, the jet (1) is manufactured more cost-effectively than by using silicon chip or wafer processing; (2) is easily integrated as part of and with the other layers of a package substrate; and (3) can be driven by a chip mounted on the package. Embodiments also include systems having and processes for forming the jet.

20 Claims, 12 Drawing Sheets

(51) Int. Cl.
*F15D 1/08* (2006.01)
*H05K 7/20* (2006.01)
*F15D 1/00* (2006.01)
*B05B 17/06* (2006.01)
*H01L 23/498* (2006.01)
*H05K 1/18* (2006.01)
*H05K 1/02* (2006.01)
*H01L 21/48* (2006.01)
*H01L 21/683* (2006.01)

(52) U.S. Cl.
CPC .............. *H01L 2221/68345* (2013.01); *H01L 2221/68381* (2013.01); *H05K 2201/10378* (2013.01)

(56) References Cited

U.S. PATENT DOCUMENTS

| | | | |
|---|---|---|---|
| 8,752,775 B2* | 6/2014 | Arik | F04B 43/095 239/102.1 |
| 2006/0185822 A1* | 8/2006 | Glezer | F04F 7/00 165/80.3 |
| 2012/0292401 A1 | 11/2012 | Mahalingam et al. | |
| 2013/0243030 A1 | 9/2013 | Mahalingam et al. | |
| 2014/0217199 A1* | 8/2014 | Arik | F04B 43/095 239/102.2 |
| 2014/0271277 A1 | 9/2014 | Whalen et al. | |
| 2015/0183635 A1 | 7/2015 | Lee et al. | |
| 2015/0185247 A1 | 7/2015 | Eid et al. | |
| 2016/0171869 A1* | 6/2016 | Gullbrand | G08B 21/182 239/72 |

* cited by examiner

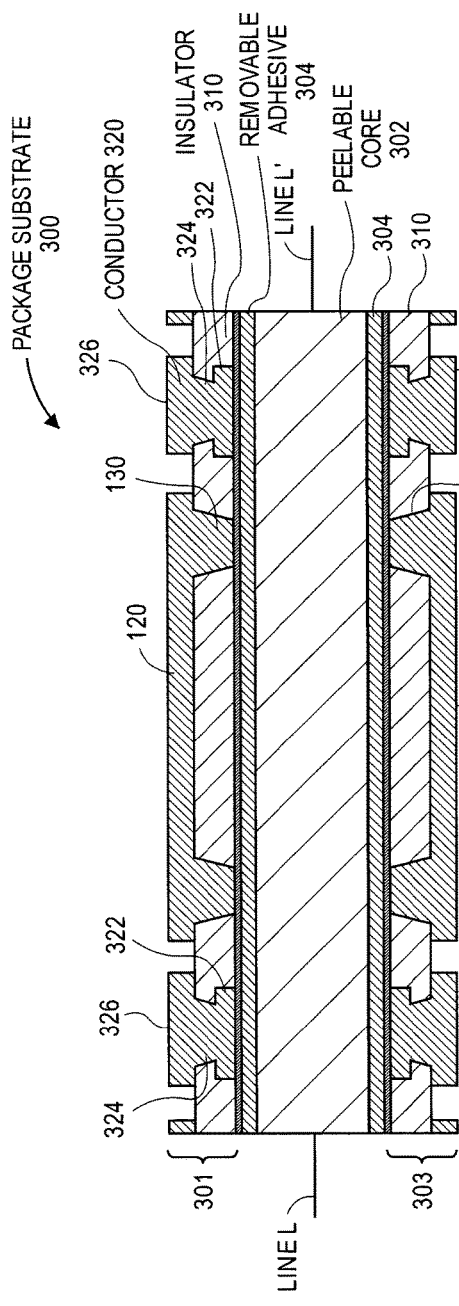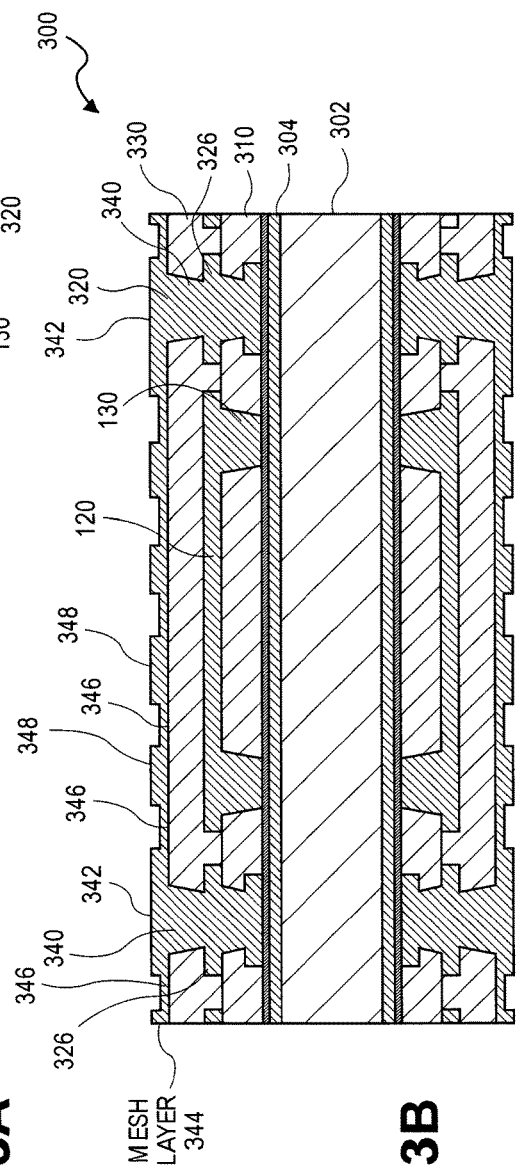

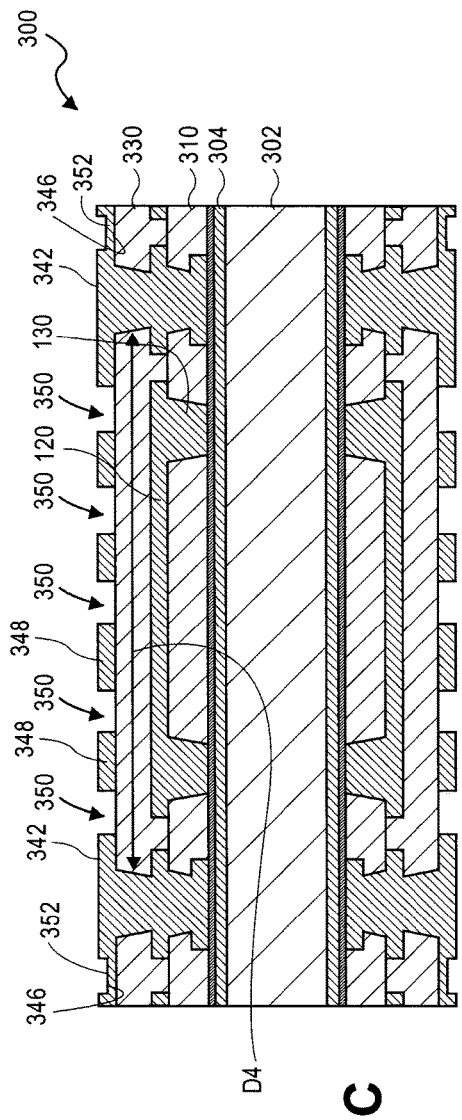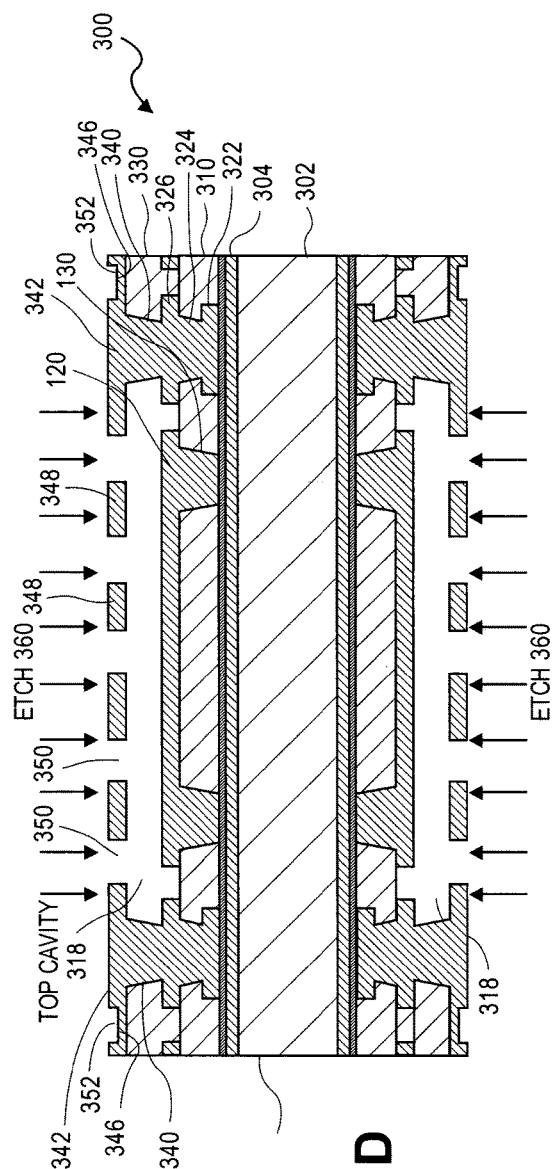
FIG. 3C
FIG. 3D

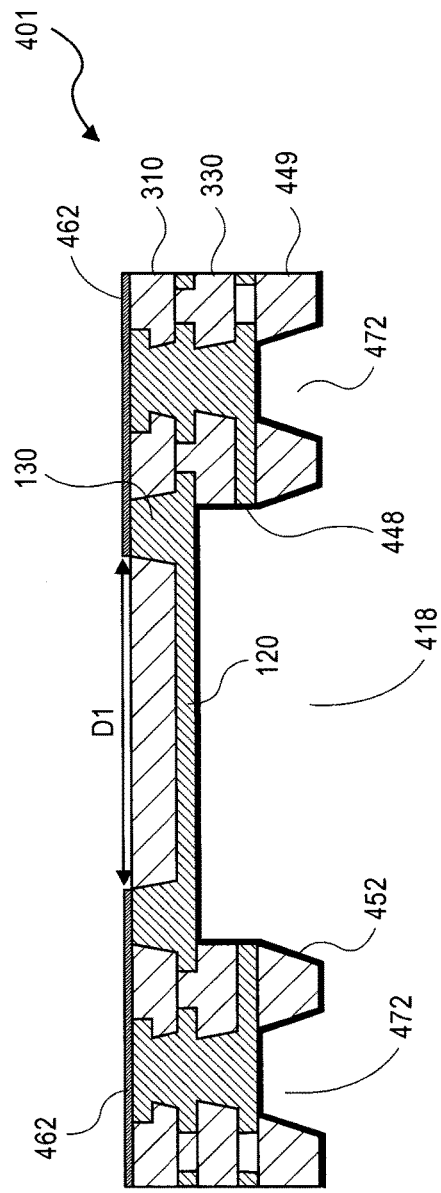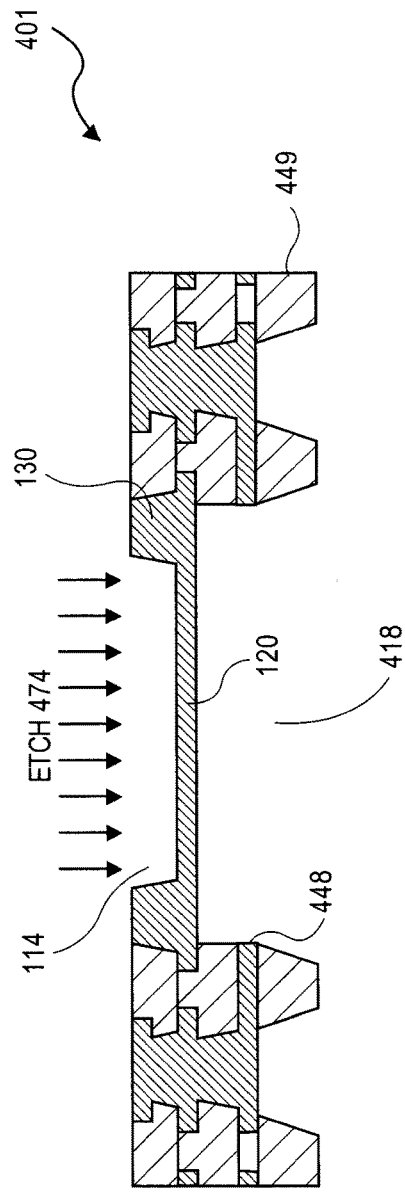
FIG. 4C
FIG. 4D

PACKAGE INTEGRATED SYNTHETIC JET DEVICE

BACKGROUND

Field

Embodiments of the invention are related to a synthetic jet device formed within or as the layers of a package substrate having layers of conductive traces, conductive vias, and dielectric material. The jet device includes an electromagnetically driven vibrating membrane of conductive material between a top and bottom cavity. A top lid with an opening covers the top cavity, and a permanent magnet is below the bottom cavity.

Description of Related Art

Traditionally, fans and blowers can be used to create airflow, such as to cool an active electronic device (e.g., transistor or computer processor) or to provide a controlled amount of airflow for sensing purposes. Unfortunately, fans and blowers are very inefficient air movers when scaling down to very small sizes such as at a millimeter (mm) scale. Thus, a device may be manufactured to deliver relatively large flow rates even for these very small scales. However, such manufacturing technologies can be time consuming and expensive. Therefore, there is a need for a quickly and inexpensively fabricated device to deliver relatively large flow rates for very small scales, such as a mm scale device.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIGS. 3A-3H show one example of a package substrate formation process for forming a synthetic jet device.

FIGS. 4A-4E show a second example of a package substrate formation process for forming a synthetic jet device.

DETAILED DESCRIPTION

Figure 1A:
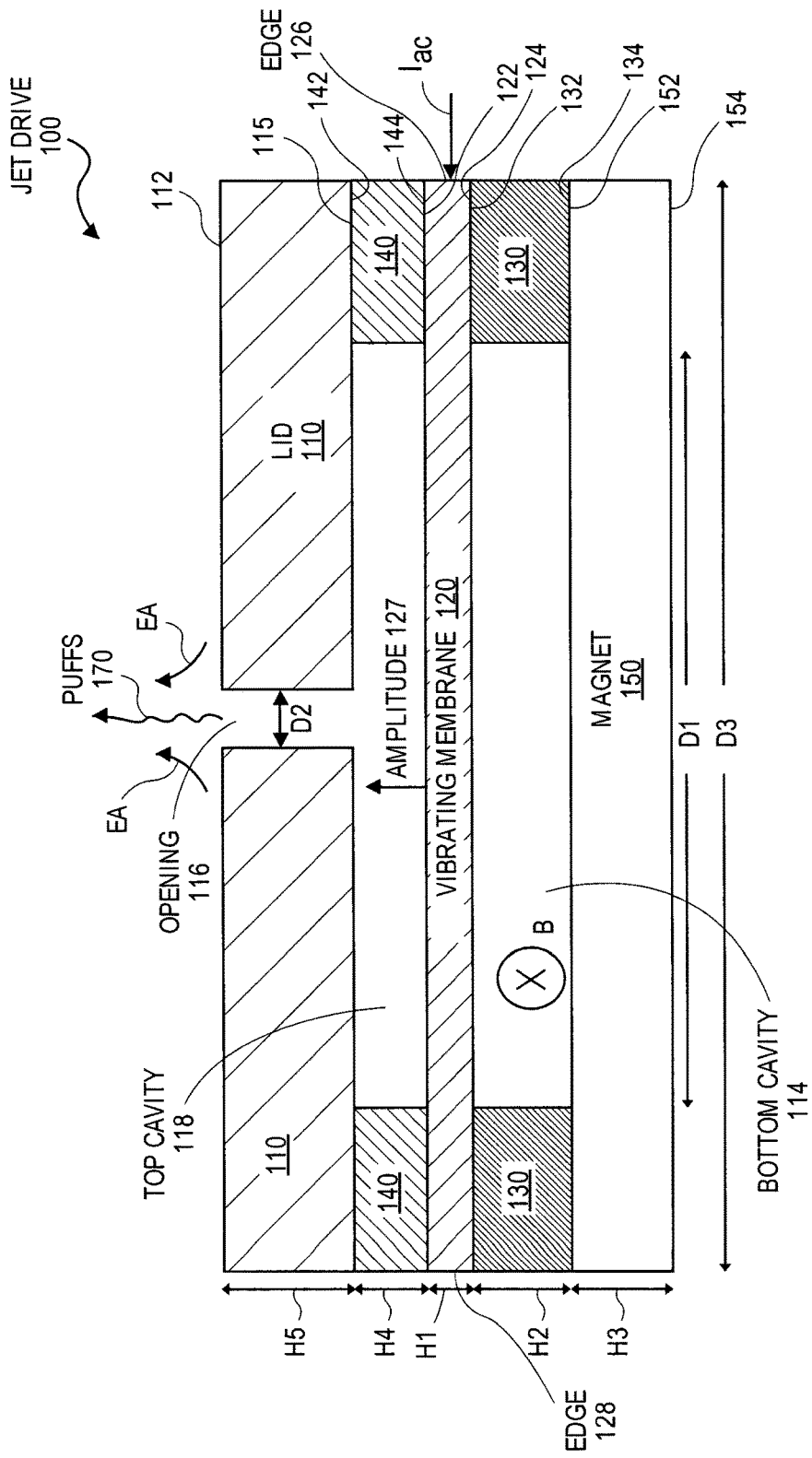
FIG. 1A shows a cross sectional view of a synthetic jet device according to embodiments of the invention.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

Traditionally, fans and blowers can be used to create airflow, such as to cool an active electronic device (e.g., transistors or a computer processor "chip") or to provide a controlled amount of airflow for sensing purposes (e.g., air quality sensors or resonant sensors). However, fans and blowers are very inefficient air movers when scaling down to very small sizes such as at a millimeter ("mm") scale.

According to embodiments (e.g., without restriction thereto), a synthetic jet device may be a preferred choice when in need of large flow rates, in applications constrained to only mm-scale devices. Such mm scale devices may include synthetic jet devices that are smaller than a few millimeters (i.e., an example can be 2 mm across, or where an outer perimeter or diameter of the device, such as diameter D3 below is between 1 and 3 mm across). Thus, synthetic jets may be a preferred technology for delivering controlled flows to sensor locations especially in space constrained devices, such as wearables (e.g., lab jackets, bracelets, watches), smartphones, tablets, etc. The mm-scale synthetic jet devices can also provide airflow in very thin air gaps to increase cooling capacity (e.g., for a computer processor or processor package), where airflow has previously not been generated. The pulsating flow from synthetic jet devices provides a well suited flow to break up thermal boundary layers to create a more uniform temperature distribution.

In some cases (e.g., without restriction thereto), a synthetic jet device may include a membrane that is free to vibrate in the vertical direction and is surrounded by cavities on both sides. The top side cavity may have an orifice or opening through which the flow is sucked in and expelled. A permanent magnet (to be integrated with the package, or attached to the device) may be used to create a magnetic field at the location of the membrane. An alternating current (AC) current may then be sent through this membrane, creating a Lorentz force that causes the membrane to vibrate up and down. During the downward motion of the membrane, the decrease in pressure in the top cavity causes air to be sucked in from the environment. In the upward motion of the membrane, the increase in pressure in the top cavity causes "puffs" of air (e.g. vortices) or fluid to be generated and expelled through the orifice. These puffs may "entrain" or draw along surrounding air along the way, creating a net outflow (e.g., "jet") away from the orifice. Entraining the surrounding air may be caused by the movement of the air of the puffs pulling air adjacent to the puffs along with and in the same direction as the puffs. Such synthetic jet devices can be designed to move or create jets of air, gas or fluid. For example, in some embodiments, instead of air, fluid may be sucked in from the environment and expelled (e.g., such as by having the cavities of the jet device liquid sealed).

In some cases, a synthetic jet device may be manufactured using silicon (e.g., computer processor "chip") or wafer manufacturing technologies (e.g., wafer based Micro-Electro-Mechanical Systems—MEMS fabrication processes) to deliver relatively large flow rates even for these small scales. However, manufacturing a jet device using these technologies can be expensive.

According to some embodiments described herein, a computer processor package device fabrication technology (e.g., "package technology" such as using processes known for forming processor package substrates) is used instead of a silicon or wafer manufacturing technology. Package technology may differ from silicon micromachining by using materials (such as copper or organic dielectric) that are less expensive than silicon, and fabricating large batches of units at a scale (e.g., 20"×20" panel) that is larger than the 6" or 8" wafer scale typically associated with silicon micromachining. This leads to a net low cost per fabricated unit when using package fabrication technology versus silicon micromachining. The package technology may be used to create jet devices, by incorporating a package process dielectric etch process (e.g., see FIGS. 3A-5) to create a computer processor package that includes the jet device. These package technology embodiments may include mm scale synthetic jet devices (e.g., see FIGS. 1-5) that are inexpensively fabricated in large batches to deliver relatively large flow rates for small sizes such as devices smaller than a few millimeters.

Using package technology (e.g., see FIGS. 3-5) offers significant advantages over silicon micromachining of jet devices, such as cost savings due to the panel-level nature of substrate package fabrication versus wafer level silicon chip manufacturing, and the absence of expensive process such as deep reactive ion etching (DRIE) which are required to realize the jet devices in silicon chips. Using packaging technology also allows tighter integration with the rest of the system (e.g., see FIG. 2), by not requiring a separate package to house the jet device or a separate application-specific integrated circuit (ASIC) die to drive the device. Instead, the driving circuitry can now be directly integrated with the system on chip (SoC) die, such as by being integrated into the processor mounted on the package that includes the jet device.

Consequently, some embodiments described herein include a package-based synthetic jet device technology to enable delivery of a controlled airflow from the jet device (e.g., see FIGS. 1A-2) by forming a synthetic jet device having a vibrating membrane that is enclosed in a cavity, and that has an orifice or opening in its lid. As the membrane vibrates, "puffs" of air are expelled through the orifice that entrain surrounding air and generate an air jet. It can be appreciated that the concepts herein can be applied to create puffs of a gas (e.g., other than air such as oxygen, hydrogen, nitrogen, fluorine, argon, helium and the like) that entrain surrounding gas and generate a gas jet. It can be appreciated that the concepts herein can be applied to create puffs of a liquid (e.g., such as water, lubricant, oil, coolant, and the like) that entrain surrounding liquid and generate a liquid jet.

Figure 1B:
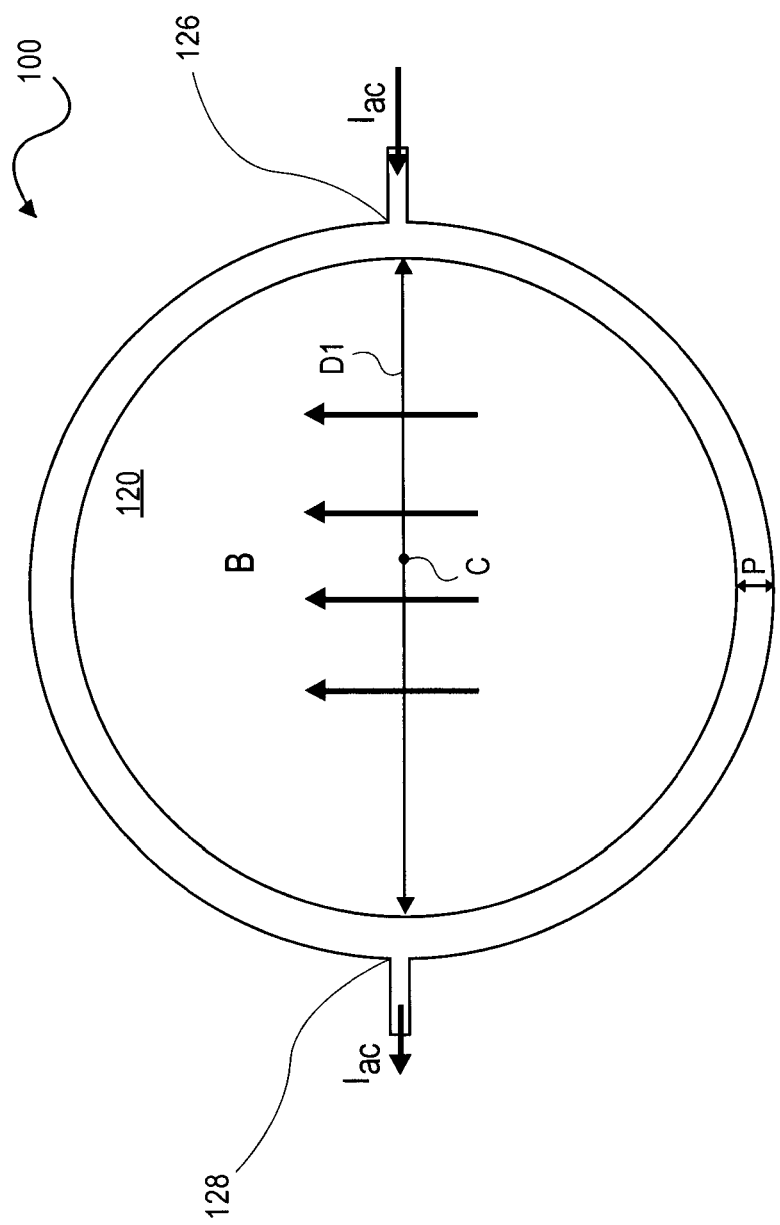
FIG. 1B shows a top view of the synthetic jet device of FIG. 1A.

More specifically, FIG. 1A shows a cross sectional view of a synthetic jet device according to embodiments of the invention. FIG. 1B shows a simplified top view of the synthetic jet device of FIG. 1A. FIG. 1 shows synthetic jet device 100 including vibrating membrane 120 disposed between top cavity 118 and bottom cavity 114. Vibrating membrane 120 has top surface 122 and bottom surface 124 which may be planar surfaces, such as surfaces fabricated by electroplating conductor over a layer including conductor and insulator during fabrication of a packaging substrate. Top surface 122 may form (e.g., may be or may define) the bottom surface of cavity 118 and bottom surface 124 may form the top surface of cavity 114. In some cases, a cavity, such as cavity 114 may be a closed in or sealed space, chamber or volume having no openings. In some cases, a cavity, such as cavity 118 may be a closed in or sealed space, chamber or volume having only one opening.

Vibrating membrane 120 may be made of a conductive material, such as a metal or alloy. In some cases, vibrating membrane may be made of conductor such as copper, gold, titanium, silver, or an alloy. Membrane 120 may be disposed in or formed as part of a package substrate, such as a package substrate for packaging, or interfacing to a microprocessor, computer processor, chip, or other logic circuitry (e.g., having active devices (e.g., transistors) and/or resistor, capacitors and diodes) as known in art. Membrane 120 may be formed by laminating or electroplating metal or copper on a layer of dielectric during a chip package fabrication process. In some cases, membrane 120 is formed as part of a package substrate, such as during formation of device 100, 301, 401 or 501 (e.g., see FIGS. 1-5).

Membrane 120 is shown above (e.g., mounted or formed on) lower support 130 and below upper support 140. In some case, membrane 120 is disposed between or suspended between (e.g., mounted or formed on) top surfaces 132 of lower support 130. In some cases, support 140 may be mounted or formed on membrane 120 (e.g., as shown in FIG. 1A). In some cases, support 140 may represent an upper support that is not mounted or formed on membrane 120 (e.g., as shown in FIGS. 3A-5).

Lower support 130 is shown having top surface 132 attached to (e.g., physically coupled to or touching) an outer perimeter or diameter of bottom surface 124. Lower support 130 forms or defines an outer surface of cavity 114 below surface 124. Lower support 130 may be formed of a conductive material, such as noted for membrane 120. Lower support 130 may be disposed in or formed as part of a package substrate or by electroplating, such as noted for membrane 120.

Outer perimeter P of surface 124, member 120 or surface 122 may be a ring shaped area from a top perspective view (e.g., see P of FIG. 1B) around the outer edge of member 120. In some cases, perimeter P may be a width or horizontal ring distance of between 3 and 5 percent of the distance of diameter D1. In some cases, perimeter P may be a width or horizontal ring distance of between 5 and 10 percent of the distance of diameter D1. In some cases, perimeter P may be a width or horizontal ring distance between diameter D3 and diameter D1. In some cases, instead of a circular diameter, perimeter P may have an inner perimeter or outer perimeter (or both) that has the shape of an oval, a rectangle, a square, a triangle, a rhombus, a trapezoid, or a polygon. In some cases, the cross sectional area of that shape will be the same as described for the circular diameter (e.g., P).

Upper support 140 is shown in FIG. 1A-B having bottom surface 144 attached to (e.g., physically coupled to or touching) an outer perimeter or diameter of top surface 122. Upper support 140 forms or defines an outer surface of cavity 118 above surface 122. Upper support 140 may be formed of a conductive material, such as noted for membrane 120. Upper support 140 may be disposed in or formed as part of a package substrate or by electroplating, such as noted for membrane 120.

Permanent magnet 150 is shown having top surface 152 coupled to bottom surface 132 and forming or defining a bottom surface of cavity 114. Magnet 150 has bottom surface 154. Magnet 150 may have an outer perimeter or diameter of top surface 152 attached by another material such as an adhesive (e.g., not physically coupled to or touching) to bottom surface 134. In some case, this perimeter extends across a portion of the width of magnet 150, similar to the width of perimeter P described for membrane 120.

Magnet 150 may be formed of or include a ferromagnetic material and produce a magnetic field, as known in the art. Magnet 150 is shown creating magnetic field B in a direction into the paper of FIG. 1A and as shown in FIG. 1B. Magnet 150 may be formed of a permanently magnetic material. Magnet 150 may be formed as part of a package substrate process such as by attaching or bonding magnet 150 to surface 134 during formation of package device (e.g., during formation of device 100, 301, 401 or 501). In some cases, magnet 150 does not move or flex vertically with respect to support 130, while membrane 120 vibrates.

According to some embodiments, feature or component 150 shown in FIGS. 1A-B is not a magnet but represents a non-magnetic layer of material shaped similar to membrane 120, but having a thickness of at least twice that of membrane 120 (or thick enough not to vibrate or change the output during use of the jet device). This layer of material may be a layer of insulator (e.g., dielectric material) shaped similar to membrane 120. In this case, a separate magnet is provided either attached to bottom surface 154 or disposed below surface 154 to create a magnetic field in cavity 114.

Top lid 110 is shown having surface 112 and bottom surface 115 coupled to top surface 142 and forming or defining a top surface of cavity 118. Top lid 110 has top surface 112. In some cases, top lid 110 has an outer perimeter or diameter of bottom surface 115 attached to (e.g., physically coupled to or touching) top surface 142. In other embodiments, top lid 110 has an outer perimeter or diameter of bottom surface 115 attached by another material such as an adhesive (e.g., not physically coupled to or touching) to top surface 142. When attached by another material, lid 110 may be formed of an insulator or of a conductive material. The attached outer perimeter may extend across a portion of the width of top lid 110, similar to the width of perimeter P described for membrane 120.

Top lid 110 is shown having opening 116, such as an opening along the center axis C of membrane 120 as shown in FIG. 1B. Opening 116 is shown formed through lid 110, such as extending from surface 112 to surface 115 (e.g., forming an opening between surface 112 and 115). Lid 110 may be formed of an insulating or dielectric material. Lid 110 may be disposed in or formed as part of a package substrate, such as a substrate for packaging, or interfacing to, a microprocessor, computer processor, chip, printed circuit board, or other logic circuitry as known in art. Top lid 110 may be a layer of insulator material or dielectric material formed during a process for forming a layer of such material during a package substrate fabrication process (e.g., see FIGS. 3-5). In some cases, lid 110 may be formed by attaching or bonding lid 110 to surface 142.

Membrane 120 is shown with height H1, support 130 is shown with height H2, magnet 150 is shown with height H3, support 140 is shown with height H4, and lid 110 (as well as opening 116) has height H5. Opening 116 is shown having diameter D2. Lid 110, support 130, support 140, membrane 120, and magnetic 150 are shown having outer perimeter or diameter D3. Support 130 and 140 are shown having inner perimeter or diameter D1. Consequently, in FIG. 1A-B cavities 114 and 118 have a diameter D1. In some cases, the upper support 140, the membrane 120 and the lower support 130 are formed of a conductor; and the lid 110 is formed of an insulator. In some cases, the upper support 140, the membrane 120 and the lower support 130 are formed of a metal or alloy; and the lid 110 is formed of a dielectric material. In some cases, the upper support 140, the membrane 120 and the lower support 130 are formed of the same material; and the lid 110 is formed of solder resist. In some cases, the upper support 140, the membrane 120 and the lower support 130 are formed of copper; and the lid 110 is formed of solder resist. In some cases, the upper support 140, the membrane 120 and the lower support 130 are formed of copper; and the lid 110 is formed of solder resist during a package formation process that forms layers of a packaging substrate including layers of electronic pads, electronic traces, electronic vias and dielectric material.

Some embodiments drive the synthetic jet device (e.g., device 100, 301, 401 or 501) electromagnetically, which, at the length scales of package substrates (e.g., 15-30 micron gap heights for cavities 114 and 118), is more effective than other means of actuation (e.g., better than electrostatic or piezoelectric actuation, which would require very high actuation voltages). Driving the synthetic jet device electromagnetically may include causing membrane 120 to vibrate by conducting an alternating current control signal (e.g., Iac) through the vibrating membrane, and having a magnet (e.g., magnet 150) located above or below the membrane to provide a magnetic field across the membrane perpendicular to the flow of current, i.e., coming out of the page in FIG. 1A.

In some cases (e.g., without restriction thereto), the resonant frequency of the membrane may be selected or predetermined (e.g., based on design of device 100) to keep this frequency above audible frequency levels (such as above 20 kHz) to achieve "quiet" operation of the system. In some cases, the Helmholtz frequency of the upper cavity be selected or predetermined (e.g., based on design of device 100) to keep this frequency above audible frequency levels (such as above 20 kHz) to achieve "quiet" operation of the system. In some cases, both frequencies are above the audible frequency level. In other cases, only one or neither frequency is about the audible frequency level. For some embodiments, the operational frequency of the synthetic jet can still be above 20 kHz even if the membrane natural frequency and/or cavity Helmholtz frequency are not. Operating the jet device above 20 kHz may result in "quiet" operation. Designing the membrane and cavity (e.g., cavity 114 and/or 118) for the same frequency may optimize the performance (e.g., optimize power and flow).

In some cases (e.g., without restriction thereto), the resonant frequency of membrane 120 may be selected or predetermined to be less than 100 kHz or below 90 kHz. In some cases, the resonant frequency of the membrane may be selected or predetermined to be less than 50 kHz. In some cases, the resonant frequency of the membrane may be selected or predetermined to be between 30-50 kHz. In some cases, the resonant frequency of the membrane may be selected or predetermined to be between 25-80 kHz. In some cases, the jet device may be inaudible due to its small size or puffs 170 (or flow 216) being small enough in volume to be inaudible to a person using a device which houses device 100 or system 200.

In FIG. 1A, membrane 120 is shown having vibrational physical amplitude 127, such as a maximum distance which a location of the top surface 122 of membrane 120 will travel or flex in the upward and downward directions during use or actuation of membrane 120. Membrane 120 may be actuated by electromagnetic force or excitation by running an alternating current through membrane 120, such as from one "edge" location to an opposing edge location of the membrane. In some cases, drive signal Iac may be an alternating current applied to one edge or location 126 of membrane 120 that flows through the membrane to the second or opposite edge or location 128 of membrane 120, as shown in FIG. 1B. In some cases, electronic contacts in the upper support, the vibrating membrane, or the lower support are electrically coupled to edges 126 and 128 of the vibrating membrane, for supplying or conducting an alternating current through the vibrating membrane.

In some embodiments, magnet 150 is a conductive or semi conductive material that is electronically isolated from membrane 120. In these embodiments, magnet 150 is electronically isolated from conductive member 130. That is, while signal Iac flows through membrane 120, it does not flow through magnet 150 or lid 110. Magnet 150 may be electronically isolated from member 130 by using an isolative epoxy, an isolative adhesive, or an insulating layer between magnet 150 and member 130.

It is considered that in some embodiments, lid 110 may be a conductive or semi conductive material that is electronically isolated from membrane 120. Here, lid 110 may be electronically isolated from conductive member 140 by using an isolative epoxy, an isolative adhesive, or an insulating layer between magnet 150 and member 140.

Membrane 120 may flex upwards or downwards, depending on whether the current Iac flowing through the membrane as shown is from right to left, or from left to right). In some embodiments, the frequency of Iac is chosen or predetermined so that the membrane forms a single peak or valley at its center C as it vibrates up and down at the frequency of Iac. This may be the "first vibrational mode" or "first harmonic" of membrane 120. In some cases, Iac is selected to have a frequency and an amount of current to cause the vibrating membrane 120 to vibrate with selected amplitude 127 as noted herein and at a selected frequency equal to the frequency of Iac. As the membrane vibrates, it pulls air through opening 116 and into cavity 118 when it flexes downwards; and then it pushes air out of cavity 118 through opening 116 when it flexes upwards. The pushing out of air may be described as creating "puffs" (e.g. vortices) of air. The puffs may be created at the frequency of Iac. It can be appreciated that if opening 116 is exposed to or in an ambient of liquid (e.g., fluid), device 100 (e.g., membrane 120) can create puffs of liquid. Although, opening 116 is shown centered in lid 110 (e.g., the opening has a central or bore axis aligned with center C), in some cases the opening may be offset with respect to the center axis of membrane 120. In some cases, opening 116 may be offset towards one of the edges of the lid from the center by a distance of one tenth, one quarter, or one third of distance D1.

For instance, FIG. 1A, shows puffs 170 of air or liquid (1) exiting opening 116 and (2) entraining surrounding air or fluid EA. Puffs 170 may exit opening 116 at a puff airflow velocity sufficient to entrain surrounding air EA while membrane 120 vibrates up and down (e.g., vibrates at the frequency of Iac). In some cases, air EA is air adjacent to or beside opening 116 that is pulled along with puffs 170 to form a net outwards (upwards and away from opening 116) flow of air at rate or velocity R. In some cases, the combination of puffs 170 and entrained air EA form a "jet" flow of air at velocity R that can be used for applications noted herein.

In some cases, rate R will depend upon, the parameters: amount of current Iac, frequency of Iac, magnetic field strength, diameter D1, diameter D2, height of member 140, height of lid 110, and membrane 120 thickness and material. Those parameters may be selected or predetermined to maximize R.

In some cases, device 100 is designed so that the Helmholtz frequency of cavity 118 matches the resonant frequency of membrane 120, thus causing a maximum of flow of air or fluid, or a maximum of rate R. For example, height H5, diameter D2 and/or the volume of cavity 118 are selected to that the Helmholtz frequency of cavity 118 matches the resonate frequency of membrane 120. In some cases, the thickness H1 or height of membrane 120, diameter D1, diameter D2, and volume of cavity 118 may be selected such that the Helmholtz frequency of cavity 118 is equal to the resonant frequency of membrane 120.

Although membrane 120 (and lid 110, supports 130 and 140, and magnet 150) are shown having a circular shape from above (e.g., see FIG. 1B), other shapes are contemplated. For example, they may have the shape of an oval, a square, a rectangle, a triangle, a rhombus, a trapezoid, or a polygon. It is considered that the cross sectional area of that shape will be the same as described for the circular diameter (e.g., D1, D3 or P as applicable). In some cases, instead of a circular diameter (e.g., D2), opening 116 may have an inner perimeter that has the shape of an oval, a rectangle, a square, a triangle, a rhombus, a trapezoid, or a polygon. In some cases, the cross sectional area of that shape will be the same as described for the circular diameter (e.g., D2).

Some embodiments include a synthetic jet device (e.g., device 100, 301, 401 or 501) formed within or as layers of a package substrate having layers of conductive traces, conductive vias, and dielectric material. Puffs of air expelled through an orifice of the device entrain surrounding air and generate an air jet which may provide a controlled amount of airflow (e.g., rate R of FIG. 1) and/or a localized cooling airflow (e.g., see flow 216 of FIG. 2). In some cases, drive signal Iac to the jet device is provided from a source of alternating current, such as a control circuit or a processor attached to a package substrate that includes the jet device.

In addition, although opening 116 is shown through lid 110, in some embodiments, opening 116 may be formed through another component of the jet. In some embodiments, opening 116 may be an opening as described for opening 116, except that it is an opening through a location of support 140 (e.g., and there is no opening through lid 110). In this case, the opening may extend from a location in the inner perimeter of support 140 directly outward (e.g., horizontally and having a center axis aligned with a line extending outward from the center C of the jet) through the support and exiting the outer perimeter of the support. In this case, D2 may be less than or equal to H4. Here, the puffs 170 and flow 216 may exit the opening through support 140 in a horizontal (e.g., a lateral or radial) direction, such as to provide controlled flow or cooling in a lateral or radial direction to the side of the jet. In some cases, the descriptions herein for forming opening 116 apply to forming the opening through support 140. In some cases, the descriptions herein for patterning and etching; forming openings through; or removing a portion of a conductor or metal can be used to form the opening through support 140. In some cases, a jet having the opening through support 140 may be disposed on its side so that the flow is directed upwards.

Figure 2:
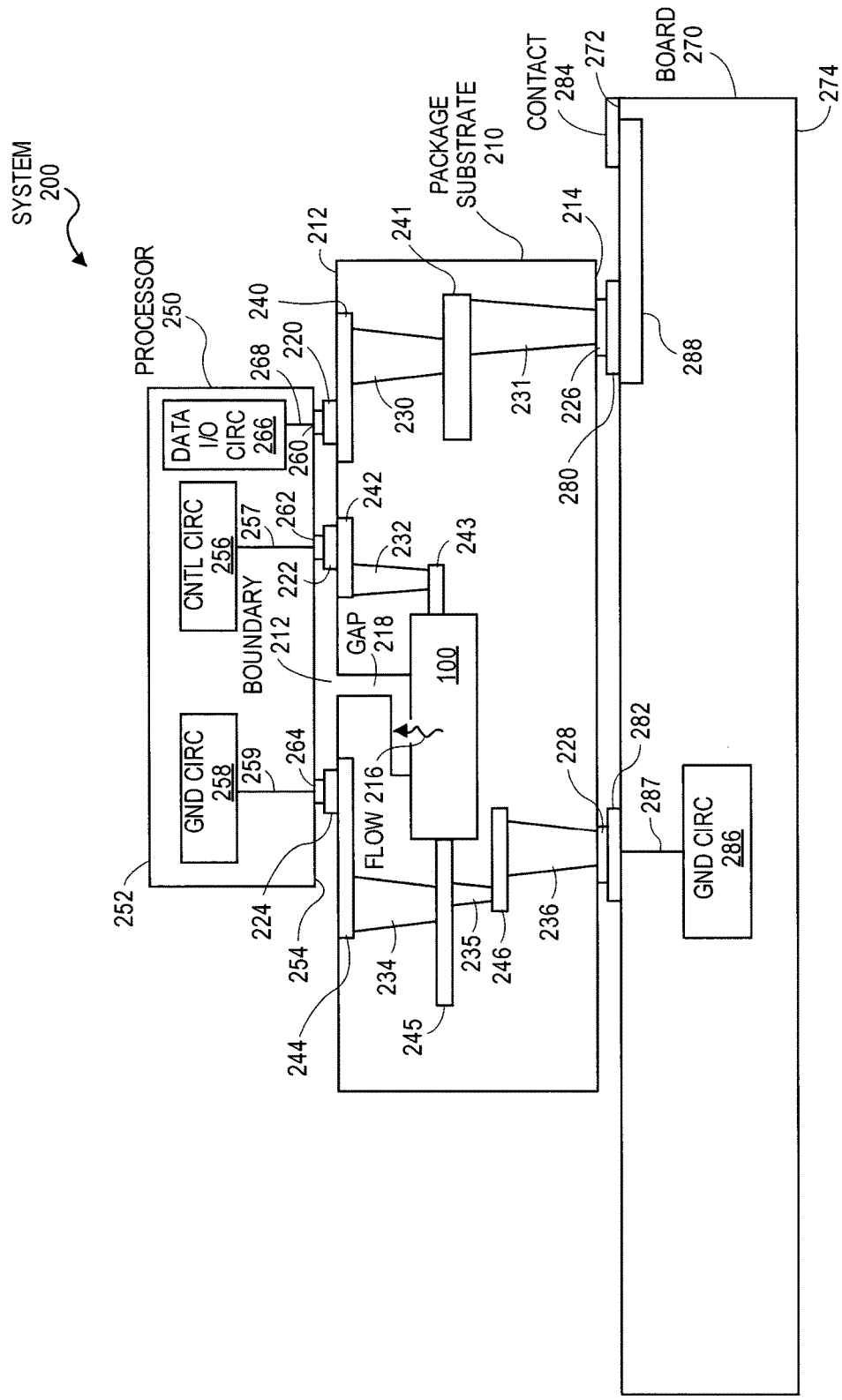
FIG. 2 shows an embodiment of a system including a synthetic jet device according to embodiments of the invention.

FIG. 2 shows an embodiment of a system including a synthetic jet device according to embodiments of the invention. FIG. 2 shows system 200 including device 100. In some cases, the device 100 of FIG. 2 represents device 301, 401 or 501. Substrate 210 is shown having top surface 212 and bottom surface 214. System 200 includes package substrate 210 having device 100 disposed within or formed within substrate 210. In this case, surface 112 is part of a layer of substrate 210 formed below surface 212, and surface 154 is part of a layer of substrate 210 formed above surface 214. Other cases contemplate that device 100 may have surface 112 disposed flush within or formed flush within surface 212 of substrate 210. In some cases, device 100 may have surface 154 disposed flush within or formed flush within surface 214 of substrate 210.

Substrate 210 is shown having top contacts 220, 222 and 224 formed on, in, or above surface 212. Substrate 210 is shown having bottom contacts 226 and 228 formed on, in, or below surface 214. Substrate 210 is shown having electrical traces (e.g., conductive traces, wires, or the like) 240, 241, 242, 243, 244, 245 and 246. Substrate 210 is shown having conductive vias or interconnects 230, 231, 232, 234, 235 and 236. Via 230 connects trace 240 to trace 241. Via 231 connects trance 241 to contact 226. Via 232 connects trace 242 to trace 243. Via 234 connects trace 244 to trace 245. Via 235 connects trace 245 to trace 246. Via 236 connects trace 246 to contact 228.

Substrate 210 may be or include a packaging substrate having a plurality of layers, the layers including layers of electronic traces, electronic vias and dielectric material. In some cases, substrate 210 is part of a package substrate, such as a package substrate for packaging, or interfacing to a microprocessor, computer processor "chip", or other logic circuitry (e.g., having active devices (e.g., transistors) and/or resistors, capacitors and diodes) as known in art. Substrate 210 may be a package substrate for packaging or upon which a computer processor is mounted, such as to interface the processor with board 270, a "motherboard", a printed circuit board, or another board having contacts and traces for interconnecting with processor 250 through substrate 210 as known in the art.

Substrate 210 may have synthetic jet device 100 disposed or encased completely within substrate 210, or within the layers of substrate 210. In some cases, device 100 is formed during formation of the layers of substrate 210. For example, membrane 120, and support 140 may be formed as layers or during formation of layers of package substrate 210, such as by processing known to form a packaging substrate. In some cases, lid 110 is formed during formation of substrate 210. In some cases, lid 110 is attached to device 100 during formation of substrate 210.

For example, membrane 120, support 130, or support 140 may be formed during formation of trace 245. For example, membrane 120, support 130, or support 140 may be formed during formation of trace 245 during formation of trace 243. Also, lid 110 may be formed during formation of a dielectric layer above trace 245 or trace 243. In some cases, magnet 150 may be attached to support 130, after dielectric is etched to remove the dielectric from between supports 130 to form cavity 114 (while not etching supports 130 or membrane 120).

In some cases, magnet 150 is formed during a separate process than the one for forming package substrate 210, and is attached to package substrate 210 during formation of package substrate 210. In some cases, lid 110 is formed during a separate process than the one for forming package substrate 210, and is attached to package substrate 210 during formation of package substrate 210. In some cases, both lid 110 and magnet 150 are formed during a separate process than the one for forming package substrate 210, and are attached to package substrate 210 during formation of package substrate 210. Attachment of magnet 150 and/or lid 110 may include using an epoxy, adhesive, or other bonding process. This attachment may include electronically insulating magnet 150 from the lower support and/or lid 110 from the upper support, as noted above.

System 200 includes processor 250, which may be mounted on or electrically coupled to surface 212. Processor 250 may be a microprocessor, computer processor, chip, or other logic circuitry (e.g., having active devices (e.g., transistors) and/or resistors, capacitors and diodes) as known in art. Processor 250 has top surface 252 and bottom surface 254. Processor 250 has contacts 260, 262 and 264. Processor 250 has data input/output (I/O) circuit 266 attached to contact 260 by data line 268. Processor 250 has control circuit 256 attached to contact 262 by control circuit line 257. Processor 250 has ground circuit 258 attached to contact 264 by ground line 259.

System 200 includes board 270 having top surface 272 and bottom surface 274. Board 270 has contacts 280, 282 and 284. Ground circuit 286 is connected through line 287 to contact 282. Board 270 includes trace 288 connecting contact 280 to contact 284. Board 270 may be a "motherboard", printed circuit board, or other board having contacts and traces for interconnecting with processor 250 through substrate 210 as known in the art.

It can be appreciated that processor 250 may provide data input and output from circuit 266 through line 268, contacts, traces, and vias as shown to provide input/output (IO) data at contact 284. This IO data may represent data to/from a computer processor, memory, co-processor, bus, and the like as known in the art.

In some cases, control circuit 256 may provide control signals, such as alternating current Iac to membrane 120 through the following features: line 257, contacts 262 and 222, traces 242 and 243, and via 232. It can be appreciated that board 270 may provide voltage bias or power (e.g., Vcc, Vdd, and the like) to processor 250 through substrate 210, such as is known in the art. It can be appreciated that board 270 may provide voltage bias or power to substrate 210, such as is known in the art.

FIG. 2 also shows flow 216, such as a flow of air or liquid. Flow 216 may represent the combination of puffs 170 and entrained air EA flowing at rate R as described for FIG. 1. Flow 216 is shown entering gap 218. Gap 218 may be a cavity, chamber, or opening in package 210 into which it is desired to have flow 216 enter (e.g., selected or predetermined locations), such as for applications described herein. Such applications may include providing a controlled flow rate R and/or a rate of flow R for cooling substrate 210 and/or processor 250. Gap 218 may be or include an air or liquid vent, pathway, tube, thin gap between or through layers of substrate 210. Thus, the mm-scale synthetic jet devices herein can also provide airflow in very thin air gap (e.g., gap 218) to increase cooling capacity (e.g., for a computer processor or processor package), where airflow has previously not been generated. The pulsating flow from the synthetic jet devices provides a well suited flow to break up thermal boundary layers (e.g., boundary 212) to create a more uniform temperature distribution. In some cases, the flow can be directed to the cooling region, be impinged, directed at an angle, and/or parallel to the surface that requires cooling.

In some cases, flow 216 includes a flow of air at rate R for increasing cooling capacity where air flow was not previously generated (e.g., in, through or out of gap 218). In some cases, flow 216 includes a flow of air at rate R for increasing cooling capacity where a forced air flow was not previously generated to provide a well suited flow for breaking up thermal boundary layers to create more uniform temperature distribution in substrate 210; in or at processor 250; or for another device near or attached to substrate 210. In some cases the flow is to break up thermal boundary 212, such a thermal boundary under or at a surface of processor 250. Thermal boundary 212 may represent a boundary layer resulting from processor 250 creating heat during use for computing performed by processor 250. Boundary 212 may represent a boundary where temperature increases moving away from substrate 210 and towards processor 250. Boundary 212 may represent a boundary in temperature that it is desired to cool down or reduce using flow 216 or rate R. In some cases, a thermal boundary layer can be created and then "broken" up with a pulsating flow from the jet. In some cases, the synthetic jet device can also increase cooling by impinging flow on a surface (perpendicular or at a different angle), parallel to the hot surface and/or "bringing" cool air to a region where cooling is wanted.

FIGS. 3A-5 are examples of a package substrate formation process (e.g., package technology) for forming synthetic jet devices such as those represented by device 100 in FIGS. 1A, 1B and 2. The formation processes of FIGS. 3A-5 may include standard package substrate formation processes and tools such as those that include or use: lamination of dielectric layers such as Ajinomoto build up films (ABF), laser or mechanical drilling to form vias in the dielectric films, lamination and photolithographic patterning of dry film resist (DFR), plating of conductive traces (CT) such as Copper (Cu) traces, and other build-up layer and surface finish processes to form layers of electronic conductive traces, electronic conductive vias and dielectric material on one or both surfaces (e.g., top and bottom surfaces) of a substrate panel or peelable core panel. The substrate may be a substrate used in an electronic device package or a microprocessor package.

For example, FIGS. 3A-3H shows one example of a package substrate formation process for forming a synthetic jet device. FIGS. 3A-3H may show a process that can be used to create a synthetic jet device in a package substrate with a die-side orifice (e.g., jet device opening 116) and a solder resist lid formed as part of the jet device (e.g., such as lid 110).

FIG. 3A shows peelable core 302 having a top and bottom surface upon which a layer of removable adhesive 304 may be formed. In some case, a thin electroless "seed" layer of conductor such as copper (or nickel or gold) is formed on or over the adhesive. Core 302, adhesive 304 and the seed layer may be part of a pre-manufactured package substrate core as known in the art of computer processor package device formation. Core 302 may be formed of ajinomoto build-up film (ABF), glass-reinforced epoxy laminate sheets (e.g., flame retardant—FR4), printed circuit board (PCB) sheets, an organic dielectric, metal or copper sheets or layers, or another material as known for creating a carrier board for a package substrate.

A layer or islands 322 of conductor 320 may be formed on adhesive 304 (or on the seed layer), such as by dry film resist (DFR) patterning and conductive plating. The plating may be electrolytic plating of conductor 320 in the seed layer, between islands of DFR formed on adhesive 304 (or on the seed layer), as known in the art. Conductor 320 may be a metal. In some cases, conductor 320 is copper, nickel or gold. In some cases, conductor 320 is copper.

Then, a layer of insulator 310 may be formed on adhesive 304 (or on the seed layer). Insulator 310 may be a dielectric material as known in the art, such as a layer of ajinomoto build-up film (ABF). Insulator 310 may be formed by an ABF lamination process as known in the art.

Then, openings may be formed at selected or predetermined locations in insulator 310 such as by using a laser as known in the art, such as a carbon dioxide laser, or by using a mechanical drill. Next, conductor (such as copper, or nickel, or gold) may be electroplated into the openings to form vias such as supports 130 and vias 324, and over selected or predetermined portions of insulator 310 to form traces 326 and membrane 120. For example, traces 326 and membrane 120 of conductor 320 may be formed by DFR photolithographic patterning and conductive metal plating (e.g., copper plating). In some cases, they are formed upon an electroless seed layer of conductor or metal formed on insulator 310 upon which the conductor may be plated.

In some cases, traces 326 are formed upon vias 324 and membrane 120 is formed on support vias 130 and over insulator 310 between support vias 130. In some cases, conductor 320 forms support 130, conductive vias 324, traces 326 and vibrating membrane 120.

In some cases, insulator 310 may have a thickness of between 15 and 35 micrometers. In some cases the thickness may be 25 micrometers. The thickness of insulator 310 may be equal to the height of cavity 114, such as by being height H2. Membrane 120 may have height H1, such that the top surface of membrane 120 is height H1+H2 above removable adhesive 304. Similarly, trace 326 may have a top surface at height H1+H2 above adhesive 304.

FIGS. 3A-3G show a substrate package formation process that starts with a first jet device 301 being formed on the top side of core 302 and a second, mirror image jet device 303 formed on the bottom surface of core 302. For example, line L-L' divides the core across its center so that below line L-L' is a mirror image of what is above line L-L'. It can be appreciated that by using such packaging substrate formation technology or processes two jet devices are being formed at once, thus forming them at twice the rate of formation as compared to using a single-side polished silicon, wafer, or chip forming process. For example, the packaging processes described for FIGS. 3A-3E, form most of two jet devices at once (e.g., during or using the same processing process) on a single package substrate. The remaining packaging processes described for FIGS. 3F-3H, to form the rest of the two jet devices may be performed at once (e.g., during or using the same processing process) or at different times on the separated substrates or devices 301 and 303.

FIG. 3B shows the substrate of FIG. 3A after laminating a second layer of insulator on the substrate. Layer of insulator 330 may be laminated on surfaces of insulator 310, conductor 326 and membrane 120. This lamination may be similar to that described for layer 310. Next, laser holes are drilled in insulator 330. These holes may be formed as described for holes formed in layer 310. Then, the holes may be plated with conductor to form vias 340. Plating may be done as described for plating to form vias 324.

Next, a layer of conductive material may be formed on vias 340 and surfaces of insulator 330. Forming the layer of conductive material may be similar to descriptions for forming layer 326 and 120. This layer may be described as mesh layer 344 which includes islands 342 on vias 340; islands 348 over layer 330 over membrane 120 (e.g., between support 130); and thin layers of conductor 346 between islands 342 and islands 348. Thus, conductor 320 may be formed on surfaces of layer 330 to form vias, traces and mesh layer 344. In FIG. 3B there may be a thin layer of conductive material 346 in layer 344 formed over the entire top surface of insulator layer 330 used as a seed layer for mesh layer 344. This thin layer is identified as layer 346 between the thicker parts 342 and 348 of the mesh.

FIG. 3C shows the substrate of FIG. 3B after patterning of thin layer 346 to form a hard mask for etching the upper cavity (e.g., cavity 118) of the jet device. FIG. 3C shows substrate 300 after patterning of layer 346 (e.g., using DFR lamination, lithography to pattern the DFR, and a wet etch process to pattern layer 346) to create a hard mask for etching the upper cavity (e.g., cavity 118) of the jet. FIG. 3C shows patterning to expose openings 350 to the top surface of insulator layer 330 between mesh islands 348. Openings 350 are where layer 346 was removed between islands 342 and 348, and in between islands 348, over layer 330 over membrane 120 (e.g., between supports 130). This wet etch used to pattern layer 346 may be selective to remove conductive material 320 but not insulator material 310.

Lamination of DFR on top of layer 346 and patterning it using lithography may protect thin layer 346 at locations 352 which are adjacent to and outside diameter D4 of what will be the top cavity of the jet device. In some cases, the etch of layer 346 in mesh layer 344 may comprise a wet etch for a selected or predetermined amount of time to remove thin layer 346 where it is exposed to the etchant (e.g., while locations 352 are protected or masked by DFR) but not remove all of the thickness of, or remove only a selected or predetermined thickness of islands 348. Locations 352 may be used to protect portions of insulator 330 that may not be part of the jet device from the subsequent insulator etching process used to create the cavity (e.g., cavity 118) of the jet device.

FIG. 3D shows the substrate of FIG. 3C after etching away a portion of insulator layer 330 above membrane 120 to form top cavity 318. In some cases cavity 318 represents cavity 118 of FIG. 1. In some cases, vias 340 and islands 342 represent support 140 as described for FIG. 1. In some cases, islands 342, vias 340, islands 326, vias 324, and islands 322 represent support 140 as described for FIG. 1. This etch may be selective to remove insulator material 310 but not conductive material 320.

Etch 360 may be an etch through openings 350 between islands 348 of conductor to remove layer 330 from cavity 318, but not to remove layer 330 outward of islands 348, such as where layer 330 is protected at locations 352 by thin layer 346 of mesh 344. In some cases, etch 360 may be an isotropic etch. The etch may remove layer 330 of insulator but not layer 310 such as by being an etch for a selected or predetermined amount of time to remove layer 330 from cavity 318 but not for long enough to remove layer 310 of insulator. In some cases, etch 360 is a plasma etch of carbon tetrafluoromethane (CF4), sulphur hexafluoride (SF6), nitrogen trifluoride (NF3), or another known etchant or etch to remove material of layer 330 (e.g., to remove insulating material or ABF).

Figure 3E:
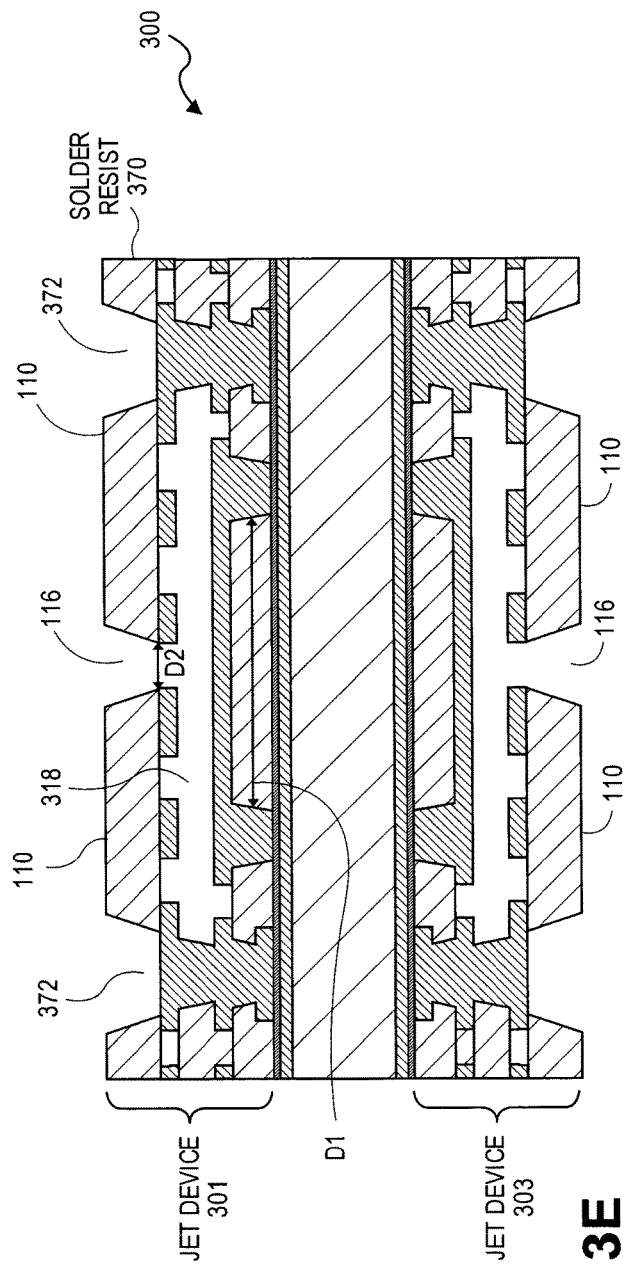

FIG. 3E shows the package substrate of FIG. 3D after removing the remainder of the thin layer 346, such as by using a wet etch, followed by forming a layer of solder resist material 370; and solder resist patterning of the layer to form lid 110 and opening 116 of the jet devices. FIG. 3E shows solder resist 370 such as an insulating organic material, laminated material, photosensitive material, or other known solder resist material. Solder resists 370 may be an insulator material formed during a substrate package formation process as described herein. Solder resist 370 may include openings 372 and 116 formed through resist 370 by patterning and developing as known in the art. This developing process may be selective to remove resist 370 in designated locations (e.g., openings 116 and 372) which were exposed or masked from exposure to light via a lithography process, depending on whether a positive or negative tone resist is used, while keeping layer 370 intact in the remaining locations. Furthermore the developing process may be chosen to be selective so as not to remove insulator material 310 or not conductor 320. Resist 370 may have height H5 that may be between 5 and 50 micrometers.

FIG. 3E shows substrate 300 having top jet device 301 and bottom, second jet device 303. It can be appreciated that as described for FIG. 3A, for FIGS. 3A-3E, two jet devices are being formed at once (e.g., during or using the same or subsequent processing process) on a single package substrate.

Figure 3F:
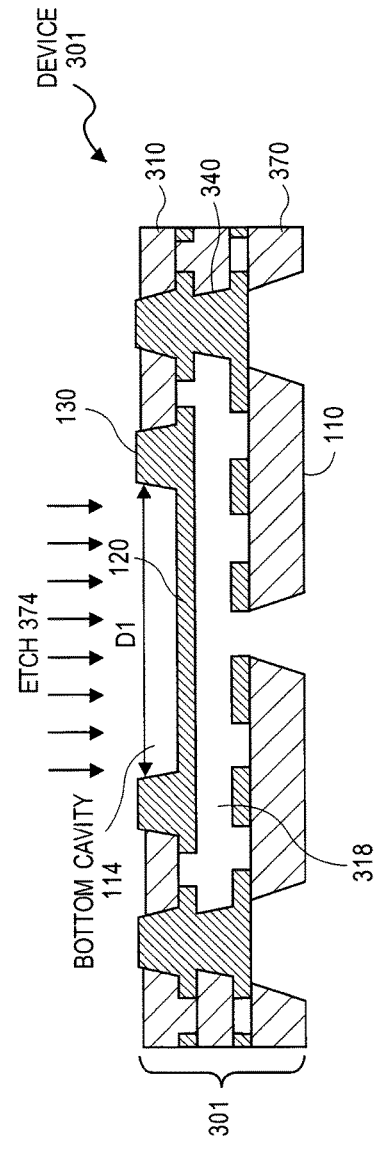

FIG. 3F shows the substrate from FIG. 3E after depaneling devices 301 and 303; flipping device 301; patterning and forming a hard mask (e.g., using a thin layer of conductor or copper, not shown) on the exposed surface of layer 310 (top surface in FIG. 3F) outside the area within where bottom cavity 114 will exist; ABF etching to remove layer 310 to form cavity 114; and finally removing the hard mask from the surface of layer 310 (e.g., by using a wet etch process). During this entire process sequence, the solder resist layer 370 may be protected from undesired etching by coating it with a passivation layer, such as silicon nitride (SiN), before any etching is started, and eventually removing this passivation layer at the end of the process flow sequence described above. In some cases, FIG. 3F shows the substrate from FIG. 3E after separating devices 301 and 303; and etching to remove a portion of layer 310 between supports 130. FIG. 3F shows jet device 301 after removing peelable core 302 and removable adhesive 304 from bottom surfaces of insulator 310, conductor 322, and support 130. This separation process may include first forming a protective passivation layer (e.g., SiN, not shown) on top surfaces of layer 370, which will be removed after etching to remove layer 310 to form cavity 114. Removal of the core 302 and adhesive 304 may be done during a package formation process, as known in the art.

Figure 3G:
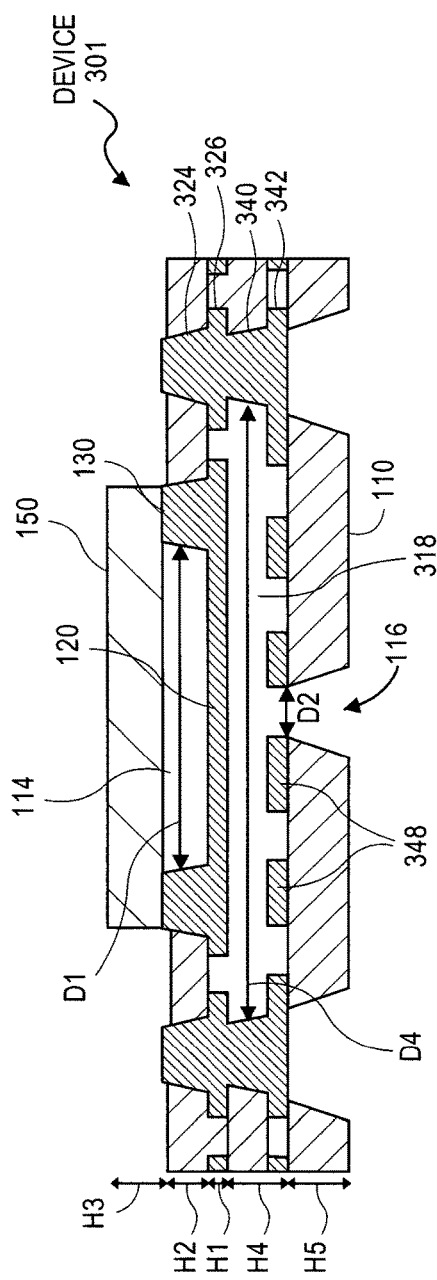

It can be appreciated that the processes described for device 301 in FIGS. 3F-G can also be performed on device 303 to create a second jet device from the substrate of FIG. 3E.

The bottom of device 301 (top surface in FIG. 3F) may then be covered with a hard mask (e.g., a thin electroless layer of conductor or copper, not shown) which may be formed over the exposed surface of layer 310 outside the area within where cavity 114 will exist to protect layer 310 outside of or away from bottom cavity 114 during etch 374 (e.g., outside of diameter D1).

Next, etch 374 may remove all of insulator 310 between support 130, or within diameter D1 (see also FIG. 1), but not remove layer 310 outside of where support 130 exists due to protection of that part of layer 310 by the hard mask (e.g., a thin electroless layer of conductor or copper, not shown). Etch 374 may be a plasma etch to remove ABF material, such as to remove layer 310 to form cavity 114. Etch 374 may be an etch or use an etchant similar to etch 360. This etch may be selective to remove insulator material 310 but not remove conductor 320.

After etch 374, any remaining hard mask (e.g., a thin electroless layer of conductor or copper, not shown) outside of supports 130 (e.g., outside of diameter D1) may be removed or etched away to expose insulator 310 as shown in FIG. 3F. Removing the electroless hard mask may include wet etching of the electroless hard mask from the top of layer 310 in FIG. 3F that was above the surface of and protecting the remaining layer 310. After that hard mask etch, another wet or dry etch may be performed to remove the protective passivation layer (e.g., SiN) that was formed over lid 110 to protect the lid during the process flow sequence used to form cavity 114.

FIG. 3G shows the substrate of FIG. 3F after attaching or forming magnet 150 to or over surfaces of support 130. FIG.

3G shows device 301 having magnet 150 attached to or over surfaces of support 130. In some cases, this attachment is as described for FIG. 1A-B.

In FIG. 3G, a magnet (e.g. magnet 150) may be attached on the board side of the package substrate. This is possible because the magnet thickness (e.g., height H3) can be selected or predetermined to be smaller or less than the post-collapse height of the ball grid array (BGA). That is, the height of the magnet may be less than the height of solder balls used in a BGA that will surface mount the package substrate (e.g., substrate 210) onto a board (e.g. board 270). In some cases, the height of the magnet (e.g., H3 of magnet 150) may be 200 micrometers, or between 100 and 300 micrometers. Such magnets may be assembled to a package substrate (e.g., substrate 210 or device 301) using a pick and place precision assembly tool or a chip cap shooter tool of a package substrate formation process. In some cases the magnet can be attached by using an epoxy or adhesive applied to the magnet and/or the surface of support 130. In some cases the cap shooter is a device where the magnet, having metalized edges, is shot onto a surface of the substrate and a solder reflow process is performed to cause the solder to attach the magnet to the substrate (e.g., support 130). The solder may be attached to (dummy) bumps that are not electrically connected to support 130 so that the magnet is electrically isolated from support 130 or membrane 120.

FIG. 3G shows jet device 301 having lid 110 with opening 116 having diameter D2; top cavity 318 having diameter D4; bottom cavity 114 having diameter D1; lower support 130, upper support 340; and vibrating membrane 120 attached to and formed on lower support 130. In some cases, the upper support may include vias 324 and 340 an islands 326. In some cases, the upper support may also include islands 342 and 348.

It can be appreciated that device 301 of FIG. 3G does not look exactly the same as device 100 shown in FIG. 1. In some cases, in device 301, lid 110 may be formed on the upper support (e.g., islands 342 and 348) which are not formed on or touching membrane 120, such as shown for support 140 of device 100 of FIG. 1. Instead, in device 301, lid 110 may be formed on the upper support such as by being formed over vias 324, at different locations than where support 130 and membrane 120 were formed on core 302. However, it can be appreciated that the concepts described above with respect to device 100 apply as well to corresponding parts of device 301. Moreover, descriptions above for cavity 118 may apply to cavity 318. Also, descriptions above for support 140 may apply to support 340. In some cases, descriptions above for selections or predeterminations, such as of diameter, height and volume of cavity 118 and support 140 may also be used for or apply to cavity 318 and support 340. However, the concepts described for device 100 and flow rate R, etc. can be selected or predetermined based on cavity 318 and support 340 substituting for cavity 118 and support 140.

Figure 3H:
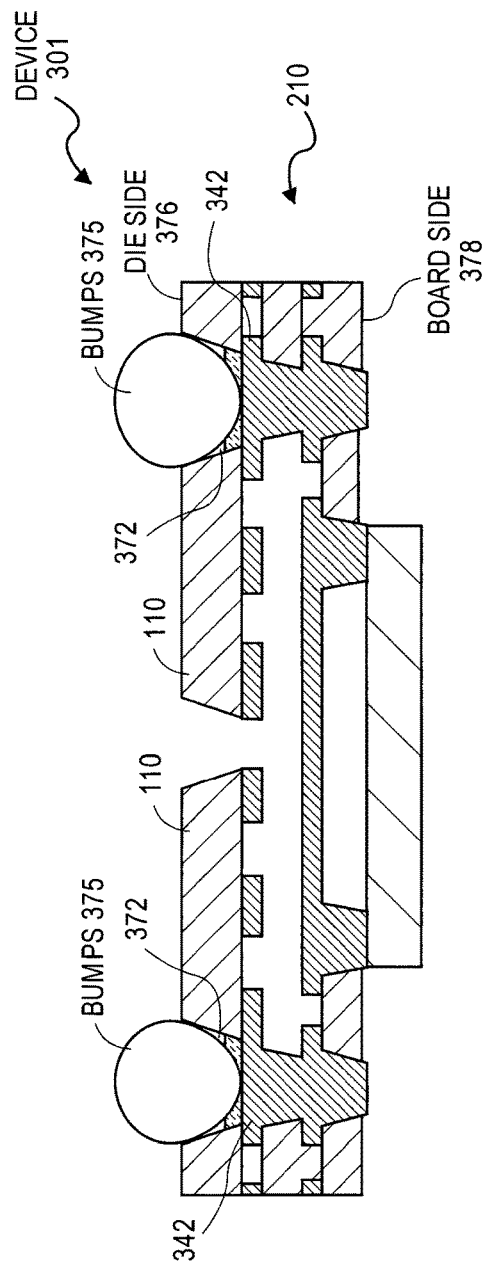

FIG. 3H shows the device of FIG. 3G after forming solder bumps in openings 372 adjacent to lid 110 through resist 370. Bumps 375 may be formed of various conductors such as tin, gold, nickel, and various other materials known for forming solder bumps. Bumps 375 may be part of flip chip bump array. Bumps 375 may be die-side 376 of device 301 and may be used to attach device 301 or a substrate containing device 301 (e.g. substrate 210) to a processor (e.g., such as processor 250). In some cases, bumps 375 represents contacts 224 and/or as shown in FIG. 2. FIG. 3H also shows board side 378 of device 301 as a side of the device upon which or towards which a board is attached (e.g. board 270). In some instance, board side 378 is touching or attached to a board, such as through contacts (e.g., contacts 228 and/or 226). In other instances, device 301 is located within a substrate, such as shown for device 100 located within substrate 210 in FIG. 2. In some cases, bumps 375 may or may not exist.

FIGS. 4A-4E show a second example of a package substrate formation process for forming a synthetic jet device. FIGS. 4A-4E show a second example that continues from or using the substrate of FIG. 3A. FIGS. 4A-4E may show a process that can be used to create a synthetic jet device in a package substrate with a die-side orifice formed in a discrete lid assembled (e.g., jet device opening 416 formed in discrete lid 410 which is separately attached to the jet device as opposed to being formed on it or laminated on it) as part of the jet device.

As compared to FIGS. 3B-3G, in FIGS. 4A-4E the opening through the lid is now in a discrete lid assembled on the die side, and the islands 348 and thin layers 346 of mesh 344 are eliminated and replaced with an open "window" 450 and the top cavity 418 may be created after the solder resist lamination 449 takes place. This can be advantageous if the solder resist lamination 370 on top of the mesh 344 in FIGS. 3E-3H is found to cause significant mesh 344 deformation. Moreover, by replacing the mesh in FIGS. 3E-3H with an open window 450, the etching 460 of FIG. 4B of the underlying ABF layer 330 from within upper support 340 is expected to occur at a faster rate than the etching 360 of FIG. 3D.

Figure 4A:
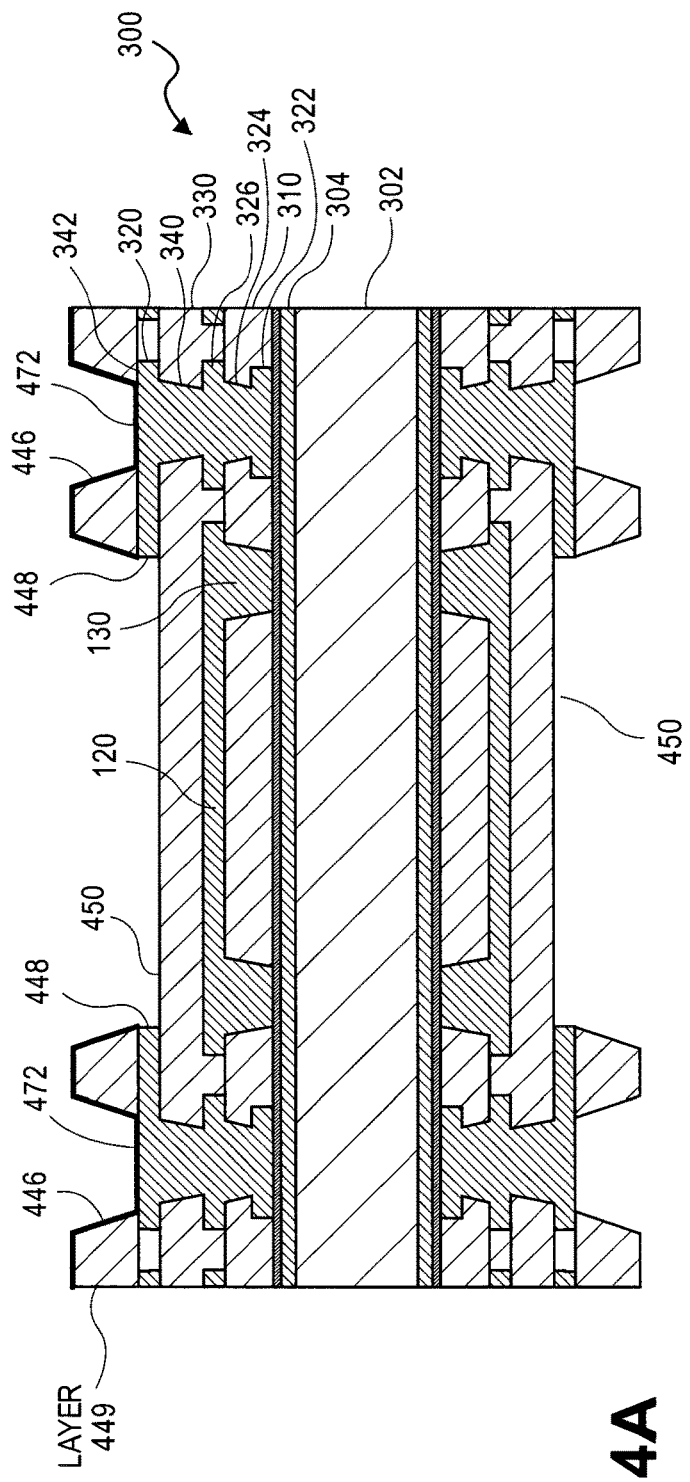
Figure 4B:
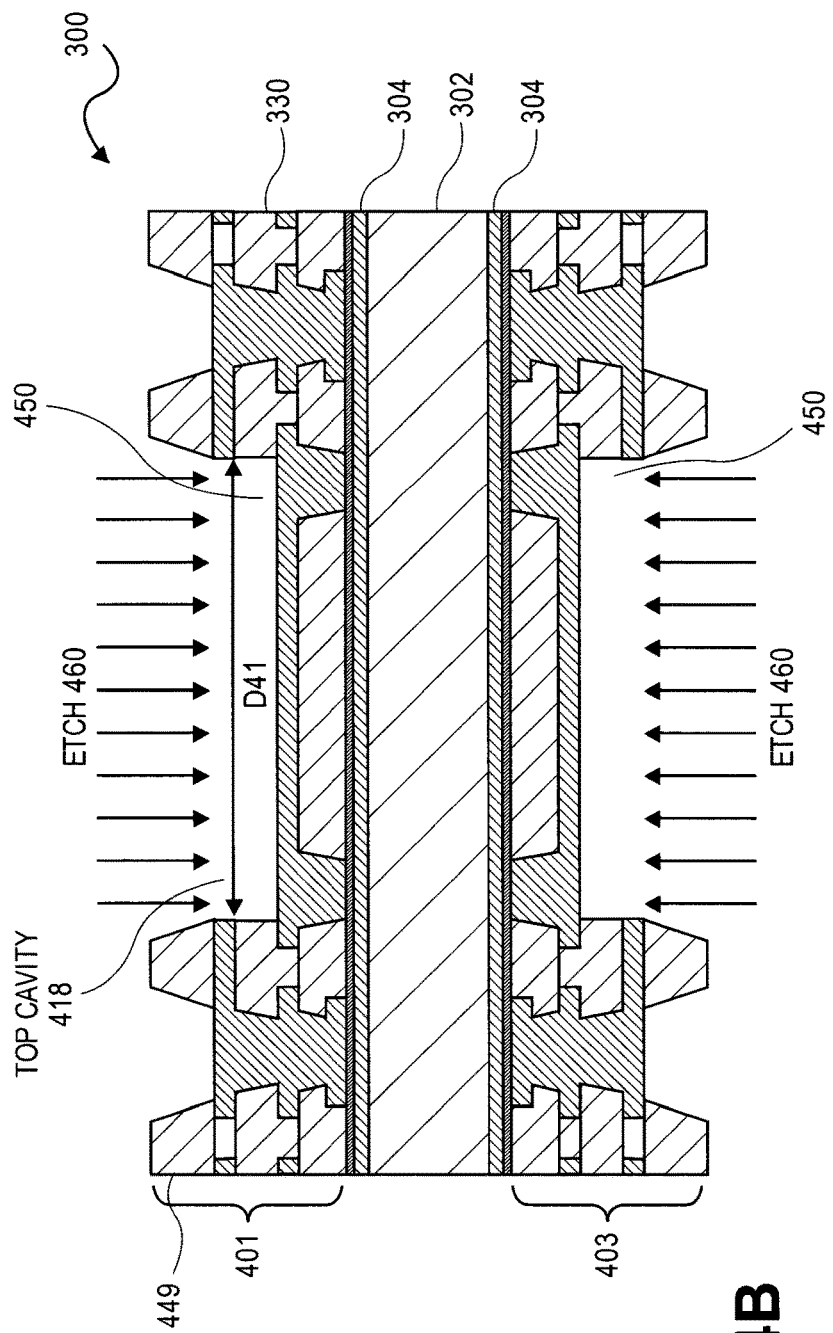

FIGS. 4A-4B show a substrate package formation process where a first jet device 401 may be formed on the top side of core 302 and a second, mirror image jet device 403 may be formed on the bottom surface of core 302 of substrate 300. This may provide advantages similar to those noted for FIGS. 3A-3G where jet devices 301 and 303 are formed on top and bottom sides of core 302, such as using such packaging substrate formation technology or processes during which two jet devices are being formed at once, thus forming them at twice the rate of formation as compared to using a single side polished silicon, wafer, or chip forming process. For example the packaging processes described for FIGS. 4A-4B, form most of two jet devices at once (e.g., during or using the same or subsequent processing process) on a single package substrate. The remaining packaging processes described for FIGS. 4C-4E, to form the rest of the two jet devices may be performed at once (e.g., during or using the same or subsequent processing process) or at different times on the separated substrates or devices 401 and 403.

FIG. 4A shows the substrate of FIG. 3A after deposition and patterning to create a hard mask for etching to form top cavity 418. FIG. 4A may shows the substrate of FIG. 3A after depositing a thin hard mask layer (such as an electrolessly plated conductor or metal, e.g. copper) and patterning it using DFR to create a hard mask for etching to form top cavity 418. FIG. 4A may show the substrate of FIG. 3A after laminating a second layer of insulator 330 on the substrate 300, drilling holes in layer 330 and plating the holes with conductor to form vias 340, such as is described for FIG. 3B.

Next, a layer of conductive material may be formed on vias 340 and surfaces of insulator 330 to form islands 342. Forming the layer of conductive material may be similar to descriptions for forming layer 342 in FIG. 3B except that the islands 348 and thin layers 346 of mesh 344 are eliminated and replaced with an open "window" 450.

Next, layer of solder resist 449 may be formed on the layer of conductive material that may be formed on vias 340.

Resist 449 may be a material that is formed during a substrate package formation process as described for solder resist 370. Solder resist 449 may include openings 472 and 450 formed through resist 449 by patterning and developing as described for layer 370 and/or as known in the art. The patterning and developing may include patterning of a photosensitive solder resist to open up locations where lid 410 or solder bumps 375 that are used for die attach are to be added later. Resist 449 may have height that is part of H4.

Then a thin hard mask layer 446 may be formed over the remaining parts of layer 449 (and optionally islands 342 in openings 472) such as by electroless plating; or by plating and then etching the thin layer from opening 450. This mask 446 may be a thin layer of conductor 320 (e.g., a thin layer of copper) formed by electroless deposition and patterning using DFR to create a hard mask for etching through or of opening 450 to remove layer 330 below opening 450 to form top cavity 418.

FIG. 4B shows the substrate of FIG. 4A after etching away a portion of insulator layer 330 above membrane 120 to form top cavity 418. In some cases cavity 418 represents cavity 118 of FIGS. 1A-B. In some cases, vias 340 and islands 342 represent support 140 as described for FIGS. 1A-B. In some cases, islands 342, vias 340, islands 326, vias 324, and islands 322 represent support 140 as described for FIGS. 1A-B.

Etch 460 may be an etch through opening 450 between islands 342 of conductor to remove layer 330 from cavity 418, but not to remove layer 330 outward of inner side surfaces 448 of islands 342, such as where layer 330 is protected by islands 448. In some cases etch 460 may be an etch for a selected or predetermined amount of time. In some cases, etch 460 may be an anisotropic etch. This etch may be selective to remove insulator material 330 but not conductor 320. In some cases, etch 460 uses an etch chemistry described for etch 360. Mask 446 may be removed after etching of layer 330 by using a wet etch process as described for removing thin layer 346.

Creating top cavity 418 after the solder resist lamination 449 takes place can be advantageous if the solder resist lamination 370 on top of the mesh 344 in FIGS. 3E-3H is found to cause significant mesh 344 deformation. Moreover, by replacing the mesh in FIGS. 3E-3H with an open window 450, the etching 460 of FIG. 4B of the underlying ABF layer 330 from within upper support 440 is expected to occur at a faster rate than the etching 360 of FIG. 3D.

FIG. 4C shows the substrate of FIG. 4B after passivating the exposed surface of the solder resist layer 449 (for example, by depositing a thin layer 452 of SiN over that surface); de-paneling devices 401 and 403; flipping device 401, patterning and forming a hard mask 462 (e.g., a thin layer of electrolessly plated conductor or copper) on the bottom of device 401 (top side in FIG. 4C) outside the area within where cavity 114 will exist. In some cases, FIG. 4C shows the substrate from FIG. 4B after separating devices 401 and 403. FIG. 4C shows jet device 401 after removing peelable core 302 and removable adhesive 304 from bottom surfaces of insulator 310, conductor 322, and support 130 such as described for FIG. 3F.

It can be appreciated that the processes described for device 401 in FIGS. 4C-F can also be performed on device 403 to create a second jet device from the substrate of FIG. 4B.

The bottom of device 401 (top side in FIG. 4C) may then be patterned and an electroless hard mask 462 may be formed over the exposed surface of layer 310 outside the area within where cavity 114 will exist to protect layer 310 outside of or away from bottom cavity 114 during etch 474 (e.g., outside of diameter D1).

FIG. 4D shows the substrate from FIG. 4C after etching to remove a portion of layer 310 between supports 130. FIG. 4D may include ABF etching to remove layer 310 to form cavity 114; removal of the electroless hard mask 462 (e.g., a thin layer of conductor or copper) by a wet etch process for example; and final etching process to remove the passivation layer 452 from surfaces of device 401.

Etch 474 may remove all of insulator 310 between support 130, or within diameter D1 (see also FIGS. 1A-B), but not remove layer 310 outside of where support 130 exists due to protection of that part of layer 310 by the electroless hard mask 462. Etch 474 may be an ABF etching to remove layer 310 to form cavity 114. This etch may be selective to remove insulator material 310 but not conductor 320. Etch 474 may be an etch or use an etchant similar to etch 360.

After etch 474, any remaining electroless hard mask 462 outside of supports 130 (e.g., outside of diameter D1) may be removed to expose insulator 310 as shown in FIG. 4D. Removing the electroless hard mask may include a wet etch of the electroless hard mask to remove it from the surface of device 401. After that etch, another etching process (e.g., an etch that attacks SiN) may be performed to remove passivation layer 452 that was formed on surfaces of device 401.

Figure 4E:
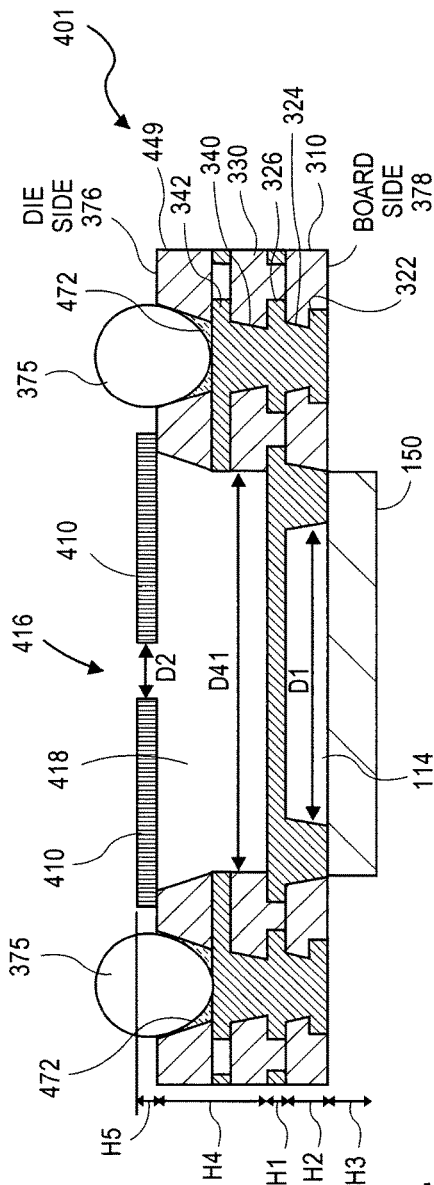

FIG. 4E shows the substrate of FIG. 4D after attaching magnet 150 to or over surfaces of support 130, forming solder bumps in openings 472 of layer 449 and attaching lid 410 to surfaces of layer 449. FIG. 4E shows device 401 having magnet 150 attached to or over surfaces of support 130.

In FIG. 4E, a magnet (e.g. magnet 150) may be attached on the board side of the package substrate. This may be similar to mounting magnet 150 in FIG. 3G. After attaching magnet 150 solder bumps 375 may be formed in openings 472 adjacent to lid 410 through resist 449. Bumps 375 may be of a similar material and attached to a similar die or processor as described for bumps 375 of FIG. 3H.

In FIG. 4E, lid 410 may be attached on the die side of the package substrate. This may be done before or after forming bumps 375. In some cases, the height of the lid (e.g., H5) may be 200 micrometers, or between 100 and 500 micrometers. Such attachment may include assembling the lid to a package substrate (e.g., substrate 210 or device 401) using a pick and place precision assembly tool or a chip cap shooter tool of a package substrate formation process. In some cases the lid can be attached by using an epoxy or adhesive applied to the lid and/or the surface of the substrate (e.g., surface of layer 449). In some cases the cap shooter is a device where the lid, having metalized edges, is shot onto a surface of the substrate and a solder reflow process is performed to cause the solder to attach the lid to the substrate (e.g., layer 449). The solder may be attached to (dummy) bumps that are not electrically connected to membrane 120 so that the lid is electrically isolated from membrane 120.

FIG. 4E shows jet device 401 having lid 410 with opening 416 having diameter D2; top cavity 418 having diameter D41; bottom cavity 114 having diameter D1; lower support 130, upper support 340; and vibrating membrane 120 attached to and formed on lower support 130. In some cases, the upper support may include vias 324 and 340, and islands 326 and 342, and layer 449. In some cases, the upper support may include layer 330, and island 342, and layer 449 such as to be an upper support attached to the top surface of membrane 120.

It can be appreciated that device 401 of FIG. 4E does not look exactly the same as device 100 shown in FIGS. 1A-B. In some cases, in device 401, lid 410 may be formed on the upper support (e.g., layer 449) which are not formed on or touching membrane 120 such as shown for support 140 of device 100 of FIGS. 1A-B. Instead, in device 401, lid 410 may be formed over layer 449 and vias 324 which were formed, at different locations than where support 130 and membrane 120 were formed on core 302. However, it can be appreciated that the concepts described above with respect to device 100 apply as well to corresponding parts of device 401. Moreover, descriptions above for cavity 118 may apply to cavity 418. Also, descriptions above for support 140 may apply to support 340. In some cases, descriptions above for selections or predeterminations, such as of diameter and height of cavity 118 and support 140 may also be used for or apply to cavity 418 and support 340. The concepts described for device 100 and rate R, etc. can be selected or predetermined based on cavity 418 and support 340 substituting for cavity 118 and support 140.

As compared to FIGS. 3B-3G, in FIGS. 4A-4E the opening through the lid may be now through a discrete lid assembled or attached on the die side of device 401.

Figure 5:
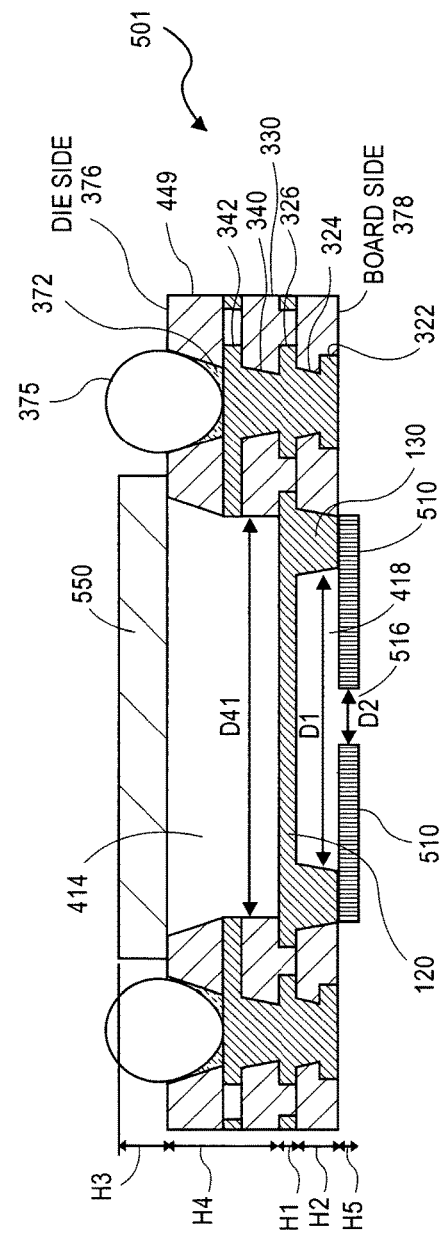
FIG. 5 shows a third example of a package substrate formation process for forming a synthetic jet device.

FIG. 5 shows a third example of a package substrate formation process for forming a synthetic jet device. FIG. 5 shows a third example that continues from or using the substrate of FIG. 4D. FIG. 5 may show a process that can be used to create a synthetic jet device in a package substrate with a board-side 378 orifice formed in a discrete lid assembled (e.g., jet device opening 516 formed in discrete lid 510) as part of the jet device.

As compared to FIGS. 4A-4E, in FIG. 5 the opening through the lid may be now in a discrete lid assembled on the board side 378 and the magnet may be on the die side 376 of the package substrate. Attaching a discrete lid can be advantageous as described for FIGS. 4A-4E as compared to FIGS. 3E-3H. In this configuration, the lid thickness H5 must be chosen to be less than the height of the BGA balls (not shown) used to attach the package substrate (e.g., substrate 210) to the board (e.g., board 270). Also, a hole may be needed in the board (e.g., board 270) to allow air exchange with the environment through the orifice (e.g., opening 516).

FIG. 5 shows the jet device of FIG. 4D after attaching lid 510 to surfaces of support 130, forming solder bumps in openings of layer 449 and attaching magnet 550 to or over surfaces of layer 449. As compared to FIG. 4E, in FIG. 5, the sides of device 401 (e.g., sides 376 and 378) that the magnet and lid are attached to may be reversed.

FIG. 5 shows device 501 having lid 510 attached to or over surfaces of support 130 on board side 378. Lid 510 may be the same material and thickness (and formed the same way) as lid 410, but may have an opening diameter D2 size designed for cavity 114. Lid 510 may be attached to surfaces of support 130 as described for attaching lid 410 to layer 449 in FIG. 4E. In this case, cavity 114 of FIG. 1 is now cavity 414 in FIG. 5 and selections and predeterminations for that cavity (e.g., see cavity 114 in FIG. 1) apply to cavity 414 of FIG. 5.

In FIG. 5, magnet 550 is attached on the die side 376 of the package substrate. Magnet 550 of FIG. 5 may be the same material and thickness (and formed the same way) as magnet 150 of FIG. 4, but may have a diameter size designed for cavity 414. Magnet 550 may be attached to surfaces of layer 449 as described for attaching magnet 150 on support 130 in FIG. 3G. In this case, cavity 118 in FIG. 1 is now cavity 418 in FIG. 5 and selections and predeterminations for that cavity (e.g., see cavity 118 in FIG. 1) apply to cavity 418 of FIG. 5. Solder bumps 375 may be formed in openings 372 adjacent to magnet 550 through resist 449. Bumps 375 may be of a similar material and attached to a similar die or processor as described for bumps 375 of FIG. 3H.

In FIG. 5, a magnet (e.g. magnet 550) may be attached on the die side 376 of the package substrate. In some cases, the height of the magnet (e.g., H3 of magnet 550) may be 200 micrometers, or between 100 and 500 micrometers. Such magnets may be assembled to a package substrate (e.g., substrate 210 or 300) using a pick and place precision assembly tool or a chip cap shooter tool of a package substrate formation process. In some cases the magnet can be attached by using an epoxy or adhesive applied to the magnet and/or the surface of the substrate (e.g., layer 449). In some cases the cap shooter is a device where the magnet, having metalized edges, is shot onto a surface of the substrate and a solder reflow process is performed to cause the solder to attach the magnet to the substrate (e.g., layer 449). The solder may be attached to (dummy) bumps that are not electrically connected to support 130 so that the magnet is electrically isolated from support 130 or membrane 120.

In FIG. 5, lid 510 may be attached on the board side 378 of the package substrate. This is possible because the lid thickness (e.g., height H5) can be selected or predetermined to be smaller or less than the post-collapse height of the ball grid array (BGA). That is, the height of the magnet may be less than the height of solder balls used in a BGA that will surface mount the package substrate (e.g., substrate 210) onto a board (e.g. board 270). In some cases, the height of the lid (e.g., H5) may be 200 micrometers, or between 100 and 300 micrometers. Such attachment may include assembling the lid to a package substrate (e.g., device 501 or support 130) using a pick and place precision assembly tool or a chip cap shooter tool of a package substrate formation process. In some cases the lid can be attached by using an epoxy or adhesive applied to the lid and/or the support 130. In some cases the cap shooter is a device where the lid, having metalized edges, is shot onto a surface of the substrate and a solder reflow process is performed to cause the solder to attach the lid to the substrate (e.g., support 130). The solder may be attached to (dummy) bumps that are not electrically connected to membrane 120 so that the lid is electrically isolated from membrane 120.

FIG. 5 shows jet device 501 having lid 510 with opening 516 having diameter D2. FIG. 5 shows a reversal of the position of the cavities and supports as compared to FIG. 4E. It can be appreciated that device 501 of FIG. 5 does not look exactly the same as device 100 shown in FIGS. 1A-B. However, it can be appreciated that the concepts described above with respect to device 100 apply as well to corresponding parts of device 501.

Moreover, descriptions of FIGS. 1A-B for cavity 118 may apply to cavity 418 of FIG. 5. In some cases, the concepts of FIGS. 1A-B described for device 100 and rate R, etc. can be selected or predetermined based on cavity 418 of FIG. 5 substituting for cavity 118 of FIGS. 1A-B. Also, descriptions of FIGS. 1A-B for cavity 114 may apply to cavity 414 of FIG. 5.

As compared to FIGS. 3B-3G, in FIG. 5 the opening through the lid may be now in a discrete lid assembled on the board side, and the magnet may be a discrete magnet assembled on the die side. As compared to FIGS. 4A-4E, in FIG. 5 the lid is now assembled on the board side, and the magnet is a discrete magnet assembled on the die side.

Embodiments described herein provide several advantages compared to the known solutions such as the following. In some cases, the airflow from embodiments of a synthetic jet device as described herein (e.g., device 100, 301, 401 or 501) can be used to generate a controlled amount of airflow (e.g., puffs 170, rate R, or flow rate of flow 216), such as for environmental monitoring and thermal management applications. Generating a controlled amount of airflow may be a requirement in environmental sensing applications in order to detect accurate concentrations of particles, pollutants, and/or toxic gases in a given environment. Generating a controlled amount of airflow may be a requirement to be able to deliver accurate concentrations for small scale and accurate solutions for sensing and detection of concentrations for air quality and mixtures. This functionality is in high demand for new devices such as wearables (e.g., lab jackets, bracelets, watches), smartphones, tablets, etc. as well as Internet of Things (IoT) systems (e.g., wireless office, retail, or industrial systems).

In some cases, the airflow from embodiments of a synthetic jet device as described herein (e.g., device 100, 301, 401 or 501) can be used to create a sufficient amount of localized airflow (e.g., puffs 170, rate R, or flow rate of flow 216) for the thermal management or cooling of processor packages (e.g., substrate 210 and/or processor 250). A sufficient amount of air flow can be used to enhance device and/or spot cooling in devices where active thermal management is generally not used (such as smartphones and tablets). It can be especially advantageous when placed close to the hot electronic components. Even a small airflow (e.g., flow 216) can be beneficial to reduce hot spot temperatures and to generate a more even temperature distribution in a processor package (or other hot component). By implementing the synthetic jet device on the package close to the hot components (i.e., a processor 250 mounted on or in the package 210), the pulsating airflow generated 216 can be used to break-up a thermal boundary layer in the gap 218 and to enhance the cooling capacity of the processor 250, allowing for higher power processor workloads of the processor. According to some embodiments, jet device 100 shown in FIG. 2 may have opening 116 to or at surface 212 of substrate 210. In this case, gap 218 does not exist, but instead flow 216 flows directly from surface 212, such as where surface 112 of FIG. 1A is level with (e.g., parallel to) or is the same surface as surface 212. In some cases, this embodiment may provide better or increased cooling of processor 250 (e.g., surface 254) as compared to those having gap 218.

In addition, it is noted that embodiments herein describe using jet device 100 in substrate 210 to provide puffs 170 and flow 216 that exit an opening in a vertical and upwards direction with respect to a top surface of substrate 210. However it is also considered that jet device 100 may be disposed to have diameter D1 oriented vertically (e.g., by locating device 100 to be on its side) in substrate 210 to provide puffs 170 and flow 216 that exit an opening in a horizontal (e.g., a lateral or radial) direction with respect to a top surface of substrate 210. This may provide a controlled flow or cooling flow of air in a predetermined horizontal direction or to a predetermined location to the side of the jet (e.g., to cool a component to the side of the jet device). This may cool a component of or in substrate 210. In addition, in some cases, jet device 100 may be disposed to have diameter D1 oriented upside down (e.g., by locating device 100 to be flipped 180 degrees with respect to the direction of flow 216) in substrate 210 to provide puffs 170 and flow 216 that exit an opening in a vertical and downwards direction with respect to a bottom surface of substrate 210. This may provide a controlled flow or cooling flow of air in a predetermined vertical and downwards direction or to a predetermined location below the jet (e.g., to cool a component below the jet device). This may cool a component of or on board 270.

Embodiments described herein provide several advantages due to using packaging formation processes instead of silicon chip or wafer processing such as the following. In some cases, embodiments of a synthetic jet device as described herein (e.g., device 100, 301, 401 or 501) are included in the creation of package-integrated synthetic jet devices to generate airflow for these types of applications (e.g., see FIGS. 2-5). Some cases include a process (e.g., see FIGS. 3A-5) for creating synthetic jet devices directly in a package substrate. Some of the process flow may use standard substrate fabrication technology and an additional dielectric etch process to release the vibrating membrane (e.g., see FIGS. 3D and 3F; or FIGS. 4B and 4D). As the membrane vibrates, "puffs" 170 of air are expelled through the orifice 116. These puffs entrain surrounding air EA and generate an air jet 216 which may provide a controlled amount of airflow and/or a localized cooling airflow 216 or rate R.

Because some embodiments of the jet are manufactured with panel-level package forming processes, it can be more cost effective than wafer level processing (e.g., using silicon or other wafers). In addition, using package forming processes creates a jet that is easily integrated as part of and with the other layers of a package substrate (e.g., see FIGS. 2-5). This integration also allows the jet driving signal (e.g., current Iac) to be provided or driven by circuitry of a chip or processor (e.g., processor 250) that is mounted on the package substrate (e.g., substrate 210 and/or device 301, 401 or 501). In fact, the jet can be used to cool the processor that controls the jet (e.g., processor 250).

In some cases, the airflow from embodiments of a synthetic jet device as described herein (e.g., device 100, 301, 401 or 501) may be used in various applications including (1) requiring a controlled airflow in an electronic sensing device, especially where the requirement of small total sensing solution exists, such as in wearables, smartphones, tablets, etc.; (2) sensing solutions for platform integration; (3) differentiation from novel sensing solutions integrated within platforms; (4) IoT standalone sensor solutions; or (5) microfluidics micro-scale pumping applications.

In some cases, the airflow from embodiments of a synthetic jet device as described herein (e.g., device 100, 301, 401 or 501) may be used in various applications including (1) a local thermal management solution for a processor; (2) other devices that require active cooling in small and/or thin devices to meet ergonomic and/or component temperature limits for high power workloads.

Figure 6:
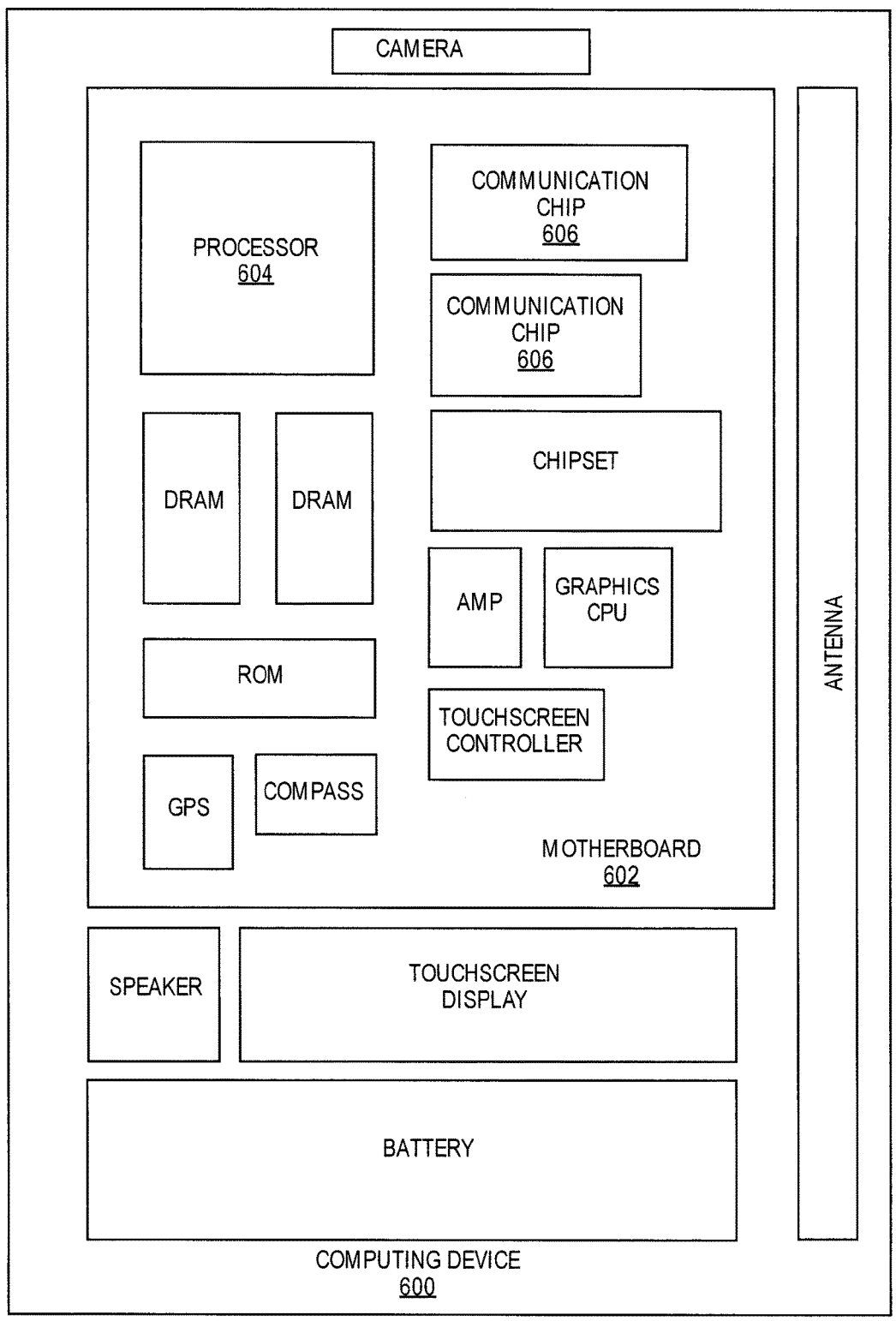
FIG. 6 illustrates a computing device, such as a system on a chip (SoC), in accordance with some implementations.

FIG. 6 illustrates a computing device 600, such as a system on a chip (SoC), in accordance with some implementations. The computing device 600 houses board 602. Board 602 may include a number of components, including but not limited to processor 604 and at least one communication chip 606. Processor 604 is physically and electrically connected to board 602, such as using or through a processor package which may include a synthetic jet device as described herein (e.g., device 100, 301, 401 or 501). In some implementations at least one communication chip 606 is also physically and electrically connected to board 602, such as using or through a processor package which may include a synthetic jet device as described herein (e.g., device 100, 301, 401 or 501), as noted herein. In further implementations, communication chip 606 is part of processor 604.

In some cases, FIG. 6 illustrates a computing device 600 including a system on a chip (SoC) 602, in accordance with one implementation. In some cases, FIG. 6 shows an example of a system on a chip (SoC) technology (e.g., motherboard 602). Such a SoC may include a microprocessor or CPU, as well as various other components, including electronics and transistors for power and battery regulation; radio frequency (RF) processing, receipt and transmission; voltage regulation; power management; and possibly other systems such as those that may be found in a cellular telephone, etc. FIG. 6 may include one or more additional processors or chips mounted on board 602 or on another component such as a different card or PCB, such as using or through a processor package which may include a synthetic jet device as described herein (e.g., device 100, 301, 401 or 501), as noted herein.

Depending on its applications, computing device 600 may include other components that may or may not be physically and electrically connected to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the integrated circuit die is packaged within, using or through a processor package which may include a synthetic jet device as described herein (e.g., device 100, 301, 401 or 501), as noted herein, thus providing more stable and increased cooling on a packaging substrate and/or processor, as noted herein, such as with reference to FIGS. 2-5. The term "processor" may refer to any device or portion of a device that processes electronic data from registers and/or memory to transform that electronic data into other electronic data that may be stored in registers and/or memory. In some cases, processor 604 may be a SoC.

Communication chip 606 also includes an integrated circuit die packaged within communication chip 606. In some implementations, this integrated circuit die is packaged within, using or through a processor package which may include a synthetic jet device as described herein (e.g., device 100, 301, 401 or 501), as noted herein, thus providing more stable and increased cooling on a packaging substrate and/or processor, as noted herein, such as with reference to FIGS. 2-5.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

The following examples pertain to embodiments.

Example 1 is a synthetic jet device comprising a vibrating membrane disposed between a top cavity and a bottom cavity; a lower support disposed between the membrane and a permanent magnet, the lower support having a bottom surface coupled to a top surface of the permanent magnet around a perimeter of the top surface of the permanent magnet; an upper support disposed between the membrane and a top lid, the upper support having a top surface coupled to a bottom surface of the top lid around a perimeter of the bottom surface of top lid; and an opening through the lid to allow puffs of air or liquid to be expelled from the top cavity through the opening when the vibrating membrane vibrates.

In Example 2, the subject matter of Example 1 can optionally include, wherein the lower support has a top surface attached to a bottom surface of the membrane around a perimeter of the bottom surface of the membrane.

In Example 3, the subject matter of Example 2 can optionally include, wherein the upper support has a bottom surface attached to a top surface of the membrane around a perimeter of the top surface of the membrane.

In Example 4, the subject matter of Example 1 can optionally include, wherein the vibrating membrane comprises an electroplated conductor, has a top surface forming a bottom surface of the top cavity and has a bottom surface forming a top surface of the bottom cavity; wherein the lower support comprises a conductive material, and forms an outer surface of the bottom cavity below the vibrating membrane; wherein the upper support comprises a conductive material, and forms an outer surface of the top cavity above the vibrating membrane; wherein the permanent magnet comprises a ferromagnetic material, has a top surface forming a bottom surface of the bottom cavity, and is electrically insulated from the vibrating membrane; wherein the top lid comprises an insulator material, and has a bottom surface forming a top surface of the top cavity; and wherein the opening extends from a top surface to the bottom surface of the lid.

In Example 5, the subject matter of Example 1 can optionally include, wherein the opening has a diameter to allow air or fluid to be sucked in and expelled to create puffs of output air or fluid at a velocity that entrains surrounding air or fluid to create a synthetic jet of air or fluid with a net outflow of the puffs and entrained surrounding air or fluid, from the top cavity and out of the opening.

In Example 6, the subject matter of Example 1 can optionally include, wherein the opening is an orifice having a diameter that is predetermined based on the volume of the cavity, the diameter of the vibrating membrane, and the thickness of the vibrating membrane; and wherein a Helmoltz frequency of the top cavity matches a resonant frequency of the vibrating membrane.

In Example 7, the subject matter of Example 1 can optionally include first and second electronic contacts electrically coupled to a first and a second edge, respectively, of the vibrating membrane, for conducting an alternating current through the vibrating membrane.

In Example 8, the subject matter of Example 1 can optionally include a source of alternating current electrically connected to the membrane through the first or second contacts; wherein the alternating current has a frequency and amount of current to cause the vibrating membrane to vibrate with a predetermined amplitude and at a predetermined frequency.

In Example 9, the subject matter of Example 1 can optionally include one of an electrically insulating epoxy, an electrically insulating adhesive, or an electrically insulating layer disposed between the lower support and the magnet; wherein the upper support, the membrane and the lower support are an electroplated copper material; and wherein the top lid is a solder resist material.

Example 10 is a package substrate comprising a plurality of layers of dielectric material; a plurality of layers of conductive material including a plurality of layers of conductive traces and conductive vias formed between the plurality of layers of dielectric material; and a synthetic jet device disposed within the package substrate and having a magnet; and some of the plurality of layers of conductive material and some of the plurality of layers of dielectric material.

In Example 11, the subject matter of Example 10 can optionally include, wherein the plurality of layers of conductive traces and conductive vias are plated onto the plurality of layers of dielectric material; and wherein the synthetic jet device is disposed within the plurality of conductive traces, conductive vias, and dielectric layers.

In Example 12, the subject matter of Example 11 can optionally include, wherein the synthetic jet device has a vibrating member that is a conductive material, has one edge coupled to a source of alternating current; and wherein the source of alternating current is a circuit or processor attached to the package substrate that includes the synthetic jet device.

In Example 13, the subject matter of Example 12 can optionally include, wherein the synthetic jet device is driven by the alternating current to provide a pulsating flow of air into a millimeter or micrometer scale air gap above an opening in the jet device to break up thermal boundaries in the gap.

In Example 14, the subject matter of Example 10 can optionally include, wherein a first electronic trace of the electronic traces is coupled through an electronic contact of the synthetic jet device to a first edge of a vibrating membrane of the synthetic jet device; and wherein a second electronic trace of the electronic traces is coupled through a second contact to a second edge of the vibrating member, wherein the second edge is disposed opposite of the first edge.

In Example 15, the subject matter of Example 14 can optionally include a processor chip mounted onto a first surface of the package substrate, the processor chip having electronic contacts coupled to electronic contacts on the first surface of the package substrate, the processor chip having a control circuit to transmit an alternating current as an electrical driving signal to the first electronic trace of the package substrate.

In Example 16, the subject matter of Example 15 can optionally include a motherboard mounted onto a second surface of the package substrate, the motherboard having electronic contacts coupled to electronic contacts on the second surface of the package substrate.

In Example 17, the subject matter of Example 10 can optionally include the synthetic jet device including a vibrating membrane disposed between a top cavity and a bottom cavity; a lower support having a top surface attached to a bottom surface of the membrane around a perimeter of the bottom surface of the membrane; an upper support having a bottom surface attached to a top surface of the membrane around a perimeter of the top surface of the membrane; wherein the magnet is a permanent magnet having a top surface coupled to a bottom surface of the lower support around a perimeter of the top surface of the permanent magnet; a top lid having a bottom surface attached to a top surface of the upper support around a perimeter of the bottom surface of the top lid; and an opening through the lid to allow puffs of air or liquid to be expelled from the opening when the vibrating membrane vibrates.

Example 18, is a method of forming a synthetic jet device; laminating a first layer of dielectric material over a carrier substrate of a package substrate; forming an opening in the first layer of dielectric material for a lower support of a vibrating membrane of the jet device; forming a metal lower support for the vibrating membrane in the opening; forming a conductive metal vibrating member on the first layer of dielectric material and on the lower support, a perimeter of the member attached to the lower support; forming a second layer of dielectric material on the vibrating member; forming an opening in the second layer of dielectric material for an upper support of a top lid of the jet device; forming a metal upper support for the top lid in the opening; etching to remove the second layer of dielectric material from above the vibrating member to form a top cavity above the vibrating member; separating the first dielectric layer from the carrier substrate; etching to remove the first layer of dielectric material from below the vibrating member to form a bottom cavity below the vibrating member; forming a top lid across a top surface of the upper support to form the top cavity between the top lid and the top surface of the vibrating member, the top lid having an opening to allow puffs of air or liquid to be expelled from the top cavity through the opening when the vibrating membrane vibrates; and attaching a magnet across the bottom surface of the lower support to form the bottom cavity between the magnet and the bottom surface of the vibrating member.

In Example 19, the subject matter of Example 18 can optionally include, wherein forming the conductive metal vibrating member comprises forming the conductive metal vibrating member so that a perimeter of the member is attached to a top surface of the lower support; wherein the upper support is formed on one of the vibrating member above the lower support, or on a separate support adjacent to the lower support; and wherein forming the lid comprises one of forming a solder resist over a layer of conductor plated on the second layer of dielectric material or attaching a discrete lid to the upper support.

In Example 20, the subject matter of Example 18 can optionally include, wherein after forming the metal upper support and before etching to remove the second layer of dielectric material, further comprising forming an upper metal layer on the second dielectric layer; forming openings through the upper metal layer, etching through the openings through the upper metal layer to remove the second dielectric layer; forming a solder resist over and covering the openings in the metal layer except for a single opening in the center of the metal layer; and coating the solder resist with a hard mask to protect portions of the solder resist during etching of the second layer of dielectric material.

In Example 21, the subject matter of Example 18 can optionally include, wherein laminating a first layer of dielectric material comprises laminating two first layers of dielectric material over two opposing surfaces of the carrier substrate; wherein forming the opening in the first layer of dielectric material for the lower support comprises forming two openings for two lower supports of two vibrating membranes in the first layers; wherein forming the metal lower support comprises forming two metal lower supports in the two openings for two jet devices; wherein forming the conductive metal vibrating member comprises forming two conductive metal vibrating members on the first layers and lower supports; wherein forming the second layer of dielectric material on the vibrating member comprises laminating two second layers of dielectric material over the two vibrating members; wherein forming the opening in the second layer of dielectric material comprises forming two openings for two upper supports of two top lids of the two jet devices; wherein forming a metal upper support for the top lid in the opening comprises forming two metal upper supports for the two top lids; wherein etching to remove the second layer of dielectric material from above the vibrating member comprises etching to remove the two second layers of dielectric material from above the two vibrating members to form two top cavities above the vibrating member; and wherein separating the first dielectric layer from the carrier substrate comprises separating the two first layers of dielectric material from the two opposing surfaces of the carrier substrate.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects of embodiments. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe using a single jet device 100 in substrate 210 is can be appreciated that 2, 3, 4, or a dozen such devices may be fabricated by a packaging formation process within substrate 210, such as to cool substrate 210 and/or processor 250. Thus, the claims following the Detailed Description are hereby expressly incorporated into this Detailed Description, with each claim standing on its own as a separate embodiment of the invention.

The invention claimed is:

1. A synthetic jet device comprising:
a vibrating membrane disposed between a top cavity and a bottom cavity;
a lower support disposed between the vibrating membrane and a permanent magnet, the lower support having a bottom surface coupled to a top surface of the permanent magnet around a perimeter of the top surface of the permanent magnet;
an upper support disposed between the vibrating membrane and a top lid, the upper support having a top surface coupled to a bottom surface of the top lid around a perimeter of the bottom surface of top lid; and
an opening through the lid to allow puffs of fluid to be expelled from the top cavity through the opening when the vibrating membrane vibrates.

2. The device of claim 1, wherein the lower support has a top surface attached to a bottom surface of the vibrating membrane around a perimeter of the bottom surface of the vibrating membrane.

3. The device of claim 2, wherein the upper support has a bottom surface attached to a top surface of the vibrating membrane around a perimeter of the top surface of the vibrating membrane.

4. The device of claim 1, wherein the vibrating membrane comprises an electroplated conductor, has a top surface forming a bottom surface of the top cavity and has a bottom surface forming a top surface of the bottom cavity;
wherein the lower support comprises a conductive material, and forms an outer surface of the bottom cavity below the vibrating membrane;
wherein the upper support comprises a conductive material, and forms an outer surface of the top cavity above the vibrating membrane;
wherein the permanent magnet comprises a ferromagnetic material, has a top surface forming a bottom surface of the bottom cavity, and is electrically insulated from the vibrating membrane;
wherein the top lid comprises an insulator material, and has a bottom surface forming a top surface of the top cavity; and
wherein the opening extends from a top surface to the bottom surface of the lid.

5. The device of claim 1, wherein the opening has a diameter to allow the fluid to be sucked in and expelled from the top cavity to create the puffs of the fluid at a velocity that entrains the fluid surrounding the synthetic jet device to create a synthetic jet of the fluid comprising the puffs of the fluid and the entrained surrounding fluid.

6. The device of claim 1, wherein the opening is an orifice having a diameter that is predetermined based on the volume of the top cavity, a diameter of the vibrating membrane, and a thickness of the vibrating membrane; and wherein a Helmoltz frequency of the top cavity matches a resonant frequency of the vibrating membrane.

7. The device of claim 1, further comprising: first and second electronic contacts electrically coupled to a first and a second edge, respectively, of the vibrating membrane, for conducting an alternating current through the vibrating membrane.

8. The device of claim 7, further comprising:
a source of the alternating current electrically connected to the vibrating membrane through the first or second electronic contacts;
wherein the alternating current has a frequency and amount of current to cause the vibrating membrane to vibrate with a predetermined amplitude and at a predetermined frequency.

9. The device of claim 1, further comprising one of an electrically insulating epoxy, an electrically insulating adhesive, or an electrically insulating layer disposed between the lower support and the magnet; wherein the upper support, the vibrating membrane and the lower support are an electroplated copper material; and wherein the top lid is a solder resist material.

10. The device of claim 1, wherein the fluid is at least one of a gas or a liquid.

11. A package substrate comprising:
a plurality of layers of dielectric material;
a plurality of layers of conductive material including a plurality of layers of conductive traces and conductive vias formed between the plurality of layers of dielectric material; and
a synthetic jet device disposed within the package substrate, the synthetic jet device having: a magnet; some of the plurality of layers of conductive material: and some of the plurality of layers of dielectric material.

12. The package substrate of claim 11, wherein the plurality of layers of conductive traces and conductive vias are plated onto the plurality of layers of dielectric material; and wherein the synthetic jet device is disposed within the plurality of conductive traces, conductive vias, and dielectric layers.

13. The package substrate of claim 12, wherein the synthetic jet device has a vibrating member that is a conductive material, has one edge coupled to a source of alternating current; and wherein the source of alternating current is a circuit or processor attached to the package substrate that includes the synthetic jet device.

14. The package substrate of claim 13 wherein the synthetic jet device is driven by the alternating current to provide a pulsating flow of fluid into a millimeter or micrometer scale fluid gap above an opening in the synthetic jet device to break up thermal boundaries in the gap.

15. The package substrate of claim 14, wherein the fluid is at least one of a gas or a liquid.

16. The package substrate of claim 11, wherein a first electronic trace of the electronic traces is coupled through an electronic contact of the synthetic jet device to a first edge of a vibrating membrane of the synthetic jet device; and wherein a second electronic trace of the electronic traces is coupled through a second contact to a second edge of the vibrating member, wherein the second edge is disposed opposite of the first edge.

17. The package substrate of claim 16 further comprising a processor chip mounted onto a first surface of the package substrate, the processor chip having electronic contacts coupled to electronic contacts on the first surface of the package substrate, and the processor chip having a control circuit to transmit an alternating current as an electrical driving signal to the first electronic trace of the package substrate.

18. The package substrate of claim 17 further comprising a motherboard mounted onto a second surface of the package substrate, the motherboard having electronic contacts coupled to electronic contacts on the second surface of the package substrate.

19. The package substrate of claim 11, the synthetic jet device including:
a vibrating membrane disposed between a top cavity and a bottom cavity;
a lower support having a top surface attached to a bottom surface of the vibrating membrane around a perimeter of the bottom surface of the vibrating membrane;
an upper support having a bottom surface attached to a top surface of the vibrating membrane around a perimeter of the top surface of the vibrating membrane;
wherein the magnet is a permanent magnet having a top surface coupled to a bottom surface of the lower support around a perimeter of the top surface of the permanent magnet;
a top lid having a bottom surface attached to a top surface of the upper support around a perimeter of the bottom surface of the top lid; and
an opening through the lid to allow puffs of fluid to be expelled from the opening when the vibrating membrane vibrates.

20. The package substrate of claim 19, wherein the fluid is at least one of a gas or a liquid.

* * * * *